(12) United States Patent
Srinivasan et al.

(10) Patent No.: US 8,229,723 B2
(45) Date of Patent: Jul. 24, 2012

(54) PERFORMANCE SOFTWARE INSTRUMENTATION AND ANALYSIS FOR ELECTRONIC DESIGN AUTOMATION

(75) Inventors: Krishnan Srinivasan, Cupertino, CA (US); Chien-Chun Chou, Saratoga, CA (US); Drew Wingard, Palo Alto, CA (US)

(73) Assignee: Sonics, Inc., Milpitas, CA (US)

( * ) Notice: Subject to any disclaimer, the term of this patent is extended or adjusted under 35 U.S.C. 154(b) by 1202 days.

(21) Appl. No.: 11/952,416

(22) Filed: Dec. 7, 2007

(65) Prior Publication Data

US 2009/0150857 A1    Jun. 11, 2009

(51) Int. Cl.
    *G06F 17/50* (2006.01)
(52) U.S. Cl. .......................................... 703/14; 717/104
(58) Field of Classification Search ................ 703/14; 717/104
    See application file for complete search history.

(56) References Cited

U.S. PATENT DOCUMENTS

| | | | |
|---|---|---|---|
| 4,727,545 A * | 2/1988 | Glackemeyer et al. | 714/33 |
| 5,948,089 A | 9/1999 | Wingard et al. | |
| 6,182,183 B1 | 1/2001 | Wingard et al. | |
| 6,330,225 B1 | 12/2001 | Weber et al. | |
| 6,505,260 B2 | 1/2003 | Chin et al. | |
| 6,578,117 B2 | 6/2003 | Weber | |
| 6,601,024 B1 | 7/2003 | Chonnad et al. | |
| 6,662,251 B2 | 12/2003 | Brock et al. | |
| 6,782,515 B2 * | 8/2004 | Scott et al. | 716/111 |
| 6,976,106 B2 | 12/2005 | Tomlinson et al. | |
| 7,065,481 B2 * | 6/2006 | Schubert et al. | 703/14 |
| 7,149,829 B2 | 12/2006 | Weber et al. | |
| 7,165,094 B2 | 1/2007 | Weber et al. | |
| 7,353,162 B2 | 4/2008 | Huang et al. | |
| 7,694,249 B2 | 4/2010 | Hamilton et al. | |
| 8,073,820 B2 | 12/2011 | Srinivasan et al. | |
| 2002/0184602 A1 | 12/2002 | Yokoyama et al. | |
| 2003/0046668 A1 | 3/2003 | Bowen | |
| 2003/0088710 A1 | 5/2003 | Sandhu et al. | |
| 2004/0054976 A1 | 3/2004 | Takahashi et al. | |
| 2004/0210696 A1 | 10/2004 | Meyer et al. | |
| 2007/0162268 A1 | 7/2007 | Kota et al. | |
| 2008/0005713 A1 | 1/2008 | Singh et al. | |
| 2008/0021888 A1 | 1/2008 | Miller | |
| 2008/0133489 A1 | 6/2008 | Armstead et al. | |
| 2010/0057400 A1 | 3/2010 | Chou et al. | |

OTHER PUBLICATIONS

Liang et al, Design with Objects: An Approach to Object-Oriented Design, Computer-Aided Design, vol. 30, No. 12, Oct. 1998, pp. 943-956.*

(Continued)

*Primary Examiner* — Russell Frejd
(74) *Attorney, Agent, or Firm* — Rutan and Tucker, LLP

(57) ABSTRACT

Various methods and apparatuses are described that provide instrumentation and analysis of an electronic design. A method for providing performance instrumentation and analysis of the electronic design includes defining a first and second set of intended software instrumentation test points and an associated first and second set of performance analysis units. The method further includes instrumenting the first and second sets of software instrumentation test points and the associated first and second sets of performance analysis units to a first model and a second model, respectively. The method further includes creating a first and a second set of software instances associated with the first and second sets of intended software instrumentation test points and associated sets of performance analysis units during run time of a first simulation and a second simulation of the electronic design associated with the first model and second model, respectively.

20 Claims, 12 Drawing Sheets

OTHER PUBLICATIONS

Hayne et al, Behavioral Fault Modeling in a VHDL Synthesis Environment, VLSI Test Symposium, 1999, pp. 333-340.*

U.S. Appl. No. 11/203,554, filed Aug. 11, 2005 Unpublished, Chou, Chein-Chun et al.

Wingard, Drew (Sonics, Inc.) "Sonics SOC Integration Architecture," P1500 Presentation, Jan. 28, 1999, pp. 1-25.

Weber, Wolf-Dietrich, "Efficient Shared DRAM Subsystems for SOC's," Systems on IC's www.sonicsinc.com, Copyright 2001, Sonics, Inc. pp. 1-6.

OCP International Partnership, "Open Core Protocol Specification," Release 1.0 OCP-IP Confidential, Document Revision 1.1.1, Copyright 2001, 184 pages total.

Kamas, Alan, "An Overview of the SystemC Models for the Open Core Protocol", The SystemC OCP Models, 2004, pp. 1-30.

Haverinen, Annssi, et al., White Paper for SystemC (tm) based SoC Communication Modeling for the OCP (tm) Protocol, V1.0, Oct. 14, 2002, pp. 1-39.

* cited by examiner

Transaction Trace Time Line for POP Variable ReqFlop.FIFO_0

PERFORMANCE SOFTWARE INSTRUMENTATION AND ANALYSIS FOR ELECTRONIC DESIGN AUTOMATION

NOTICE OF COPYRIGHT

A portion of the disclosure of this patent document contains material that is subject to copyright protection. The copyright owner has no objection to the facsimile reproduction by anyone of the software engine and its modules, as it appears in the Patent and Trademark Office Patent file or records, but otherwise reserves all copyright rights whatsoever.

FIELD OF THE INVENTION

Embodiments of the invention generally relate to electronic design automation. An aspect is related to performance software instrumentation and analysis of the electronic design at different levels of abstraction.

BACKGROUND OF THE INVENTION

High-level system description methodologies can allow designers and system architects to modify the traditional system design approach. Some languages, such as SystemC, may allow system architects to model a circuit or system at a transaction-level in order to test the specified functionality and get early performance reports.

SystemC is a set of library routines and macros implemented in C++, which makes it possible to simulate concurrent processes, each described by C++ syntax. Software objects instantiated in the SystemC framework may communicate in a simulated real-time environment, using signals of all the datatypes offered by C++, some additional ones offered by the SystemC library, as well as user defined.

The traditional design cycle for an integrated circuit still follows or often runs concurrently with this architectural modeling. The design will be written in a hardware description level usually at RTL (register transfer level) to be synthesized and finalized into silicon.

Some prior approaches are not able to quickly and efficiently monitor and analyze a circuit or system performance early in the design cycle resulting in a longer design cycle and slower time to market for the design.

SUMMARY OF THE INVENTION

Various methods and apparatuses are described for an electronic design automation (EDA) modeling tool that includes a definition module that defines a first full set of possible software instrumentation test points for a simulation of an electronic system being modeled with a first executable behavioral model coded at a first level of abstraction. The definition module also defines a second full set of possible software instrumentation tests for a simulation of the electronic system being modeled with a second executable behavioral model coded at a second level of abstraction.

The EDA modeling tool also includes a population module that populates both instances of the first set of possible software instrumentation test points in the first model and instances of the second set of possible software instrumentation test points in the second model. A performance instrumentation platform then creates a first set of software objects associated with a subset of the first set of possible software instrumentation test points that are enabled by the user for the run of the first simulation as well as create a second set of software objects associated with a subset of the second set of possible software instrumentation test points that are enabled by the user for the run of the second simulation.

The second full set of possible software instrumentation test points is configured to capture similar measurement quantities as the first full set of possible software instrumentation test points. The modeling tool provides users with performance instrumentation in order to analyze and debug their electronic designs for all of the different phases of their product development. For example, a comparison module may compare the similar measurement quantities between the first and second enabled subsets of instrumentation points to discern differences in the executable behavioral models coded at different levels of abstraction.

BRIEF DESCRIPTION OF THE DRAWINGS

The drawings refer to embodiments of the invention in which.

Figure 1A:
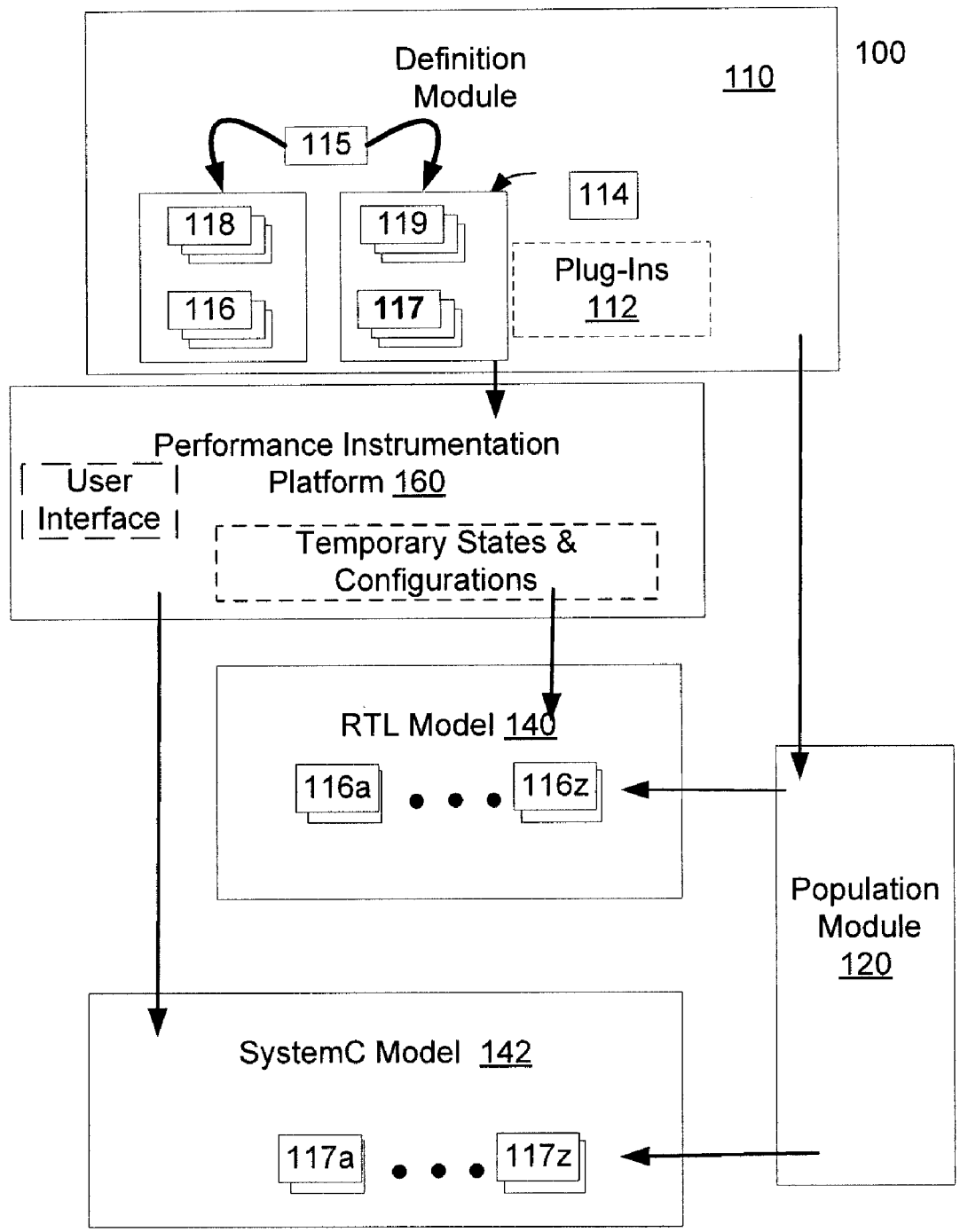
FIG. 1a illustrates a block diagram of an embodiment of an electronic design automation (EDA) modeling tool for performing performance instrumentation and analysis for an electronic system.

While the invention is subject to various modifications and alternative forms, specific embodiments thereof have been shown by way of example in the drawings and will herein be described in detail. The invention should be understood to not be limited to the particular forms disclosed, but on the contrary, the intention is to cover all modifications, equivalents, and alternatives falling within the spirit and scope of the invention.

DETAILED DISCUSSION

In the following description, numerous specific details are set forth, such as examples of specific data signals, named components, connections, etc., in order to provide a thorough understanding of the present invention. It will be apparent, however, to one of ordinary skill in the art that the present invention may be practiced without these specific details. In other instances, well known components or methods have not been described in detail but rather in a block diagram in order to avoid unnecessarily obscuring the present invention. Further specific numeric references such as a first instance of a transactor, may be made. However, the specific numeric reference should not be interpreted as a literal sequential order but rather interpreted that the first instance of a transactor is different than a second instance of a transactor. Thus, the specific details set forth are merely exemplary. The specific details may be varied from and still be contemplated to be within the spirit and scope of the present invention. In general, various methods and apparatuses are described for an EDA modeling tool that includes a definition module that defines a first full set of every possible software instrumentation test point for a simulation of an electronic system. The electronic system is typically modeled with a first executable behavioral model coded at a first level of abstraction, such as coded at RTL. The definition module also defines a second full set of every possible software instrumentation test point for a simulation of the electronic system being modeled with a second executable behavioral model coded at a different level of abstraction than the first level of abstraction.

The EDA modeling tool also includes a population module that populates both instances of a first subset of the possible software instrumentation test points in the first executable behavioral model and instances of a second subset of the possible software instrumentation test points in the second executable behavioral model. A performance instrumentation platform then creates a first set of software objects associated with one or more of the first subset of possible software instrumentation test points that are actually selected by a user to be enabled for a run of the first simulation. The performance instrumentation platform then also creates a second set of software objects associated with one or more of the second subset of possible software instrumentation test points that are selected by the user to be enabled for a run of the second simulation.

The second subset of possible software instrumentation test points is configured to capture similar measurement quantities as the first subset of possible software instrumentation test points. The modeling tool provides users with performance instrumentation in order to analyze and debug their electronic designs for all of the different phases of their product development.

An architectural phase of the design of the electronic system can be optimized with a high level SystemC model that is instrumented with software instrumentation test points and performance analysis units that analyze data collected by the test points. A low level RTL model can collect data and provide analysis based on using software instrumentation test points and performance analysis units that analyze data collected by the test points. In one embodiment, these test points and performance analysis units correspond to those of the SystemC model. Collected data and analysis of the two models (e.g., RTL and SystemC) can then be compared to determine performance of the electronic system. The modeling tool provides consistent instrumentation and a common post-processing infrastructure to allow easy comparisons between different models (e.g., SystemC, RTL, silicon). For example, the first executable behavioral model having the first level of abstraction may be the SystemC model and the second executable behavioral model having the second level of abstraction may be the RTL model.

As discussed, many electronic designs are written at a register-transfer level (RTL) description of a circuit or system in a hardware description language. Generally, a RTL description describes what intermediate information (i.e. information stored between clock cycles in an electronic circuit) is stored in registers, where it is stored within the design, and how that information moves through the design as it operates. The RTL description of an electronic design is a functional description at least one level of abstraction higher than the individual gate layout of the electronic system (e.g., gate-level implementation/Netlist). The RTL description fully and explicitly describes virtually all of the logic and sequential operations of the circuit. RTL descriptions are commonly written in standard languages such as Verilog or VHDL and are intended for logic synthesis and mapping with a commercial logic synthesizer.

A transaction-level model can be a software-coded model of a circuit or a system where data transfers are simplified and abstracted. This model is typically written in a high-level software language, such as C, C++ or SystemC. RTL may be considered Transaction Level 0 (TL0) and correspond directly with signals in the open core protocol specification. Transaction Level 1 (TL1) modeling may correspond to a given protocol's phase level on an individual transfer basis and be cycle accurate. Transaction Level 2 (TL2) modeling may correspond to one or more open core protocol transfers or transactions at the same time and can be transaction accurate but cycle approximate. For example, if a system implements burst data transfers between components, this burst may be expressed using a single function call in the implementation language. The difference in the number of application programming interface calls or events can cause timing inaccuracies between these different levels of abstraction.

A transaction can be a functional unit of data transfer through a system. A transaction may be an aggregate of multiple data transfers but is tied by a semantic unity. For example, a transaction may merely be group transfers at consecutive addresses between the same two components of the system.

FIG. 1a illustrates a block diagram of an embodiment of an electronic design automation (EDA) modeling tool for performing performance instrumentation and analysis for an electronic system. The EDA modeling tool 100 includes a definition module 110 with a creation layer 114 to a first full set of every possible software instrumentation test point 116 for a simulation of an electronic system being modeled with a first executable behavioral model coded at a first level of abstraction. The definition module 110 may also define a second full set of every possible software instrumentation test point 117 for a simulation of the electronic system being modeled with a second executable behavioral model coded at a different level of abstraction. The second full set of possible software instrumentation test points is configured to capture similar measurement quantities as the first full set.

The definition module may define the first set of possible software instrumentation test points 116 prior to run time, or at run time, of the first simulation of an electronic system being modeled with the first executable behavioral model 140 coded at the first level of abstraction. The definition module 110 also then defines a second set of intended software instrumentation test points 117 via the creation layer 114 prior to run time, or at run time, of a second simulation of the electronic system being modeled with a second executable behavioral model 142 coded at the second level of abstraction. The definition module 110 includes plug-in programs 112 for interfacing with the definition module 110 in order to add things, such as additional definitions of possible instrumentation test points 115.

The population module 120 populates instances of a first subset of possible software instrumentation test points in the first executable behavioral model 140 as well as populates instances of a second subset of possible software instrumentation test points in the second executable behavioral model 142. For example, the population module 120 generates instances 116a through 116z of the first subset of possible software instrumentation test points containing two of the three possible defined instrumentation test points in this example. The population module 120 populates the generated instances of the first subset of possible software instrumentation test points 116a through 116z in the RTL executable behavioral model 140. The population module 120 populates similar generated instances of a second subset of possible software instrumentation test points 117a through 117z in the SystemC executable behavioral model 142. The performance instrumentation platform 160 then creates a first set of software objects associated with one or more of the first subset of possible software instrumentation test points 116a-116z that are selected by the user to be enabled for the run of the simulation of an instance of the RTL executable behavioral model 140. The performance instrumentation platform 160 also creates a second set of software objects associated with one or more of the second subset of possible software instrumentation test points 117a-117z that are selected by the user to be enabled for the run of the simulation of an instance of the SystemC executable behavioral model 142. The subset of enabled test points by the performance instrumentation platform 160 may include all or merely some of the sets of software instrumentation test points 116a-116z and 117a-117z populated in the RTL model 140 and the SystemC model 142 of the electronic system.

A comparison module may later compare the similar measurement quantities between the first and second enabled subsets of instrumentation points to discern differences in the executable behavioral models coded at different levels of abstraction.

Figure 1B:
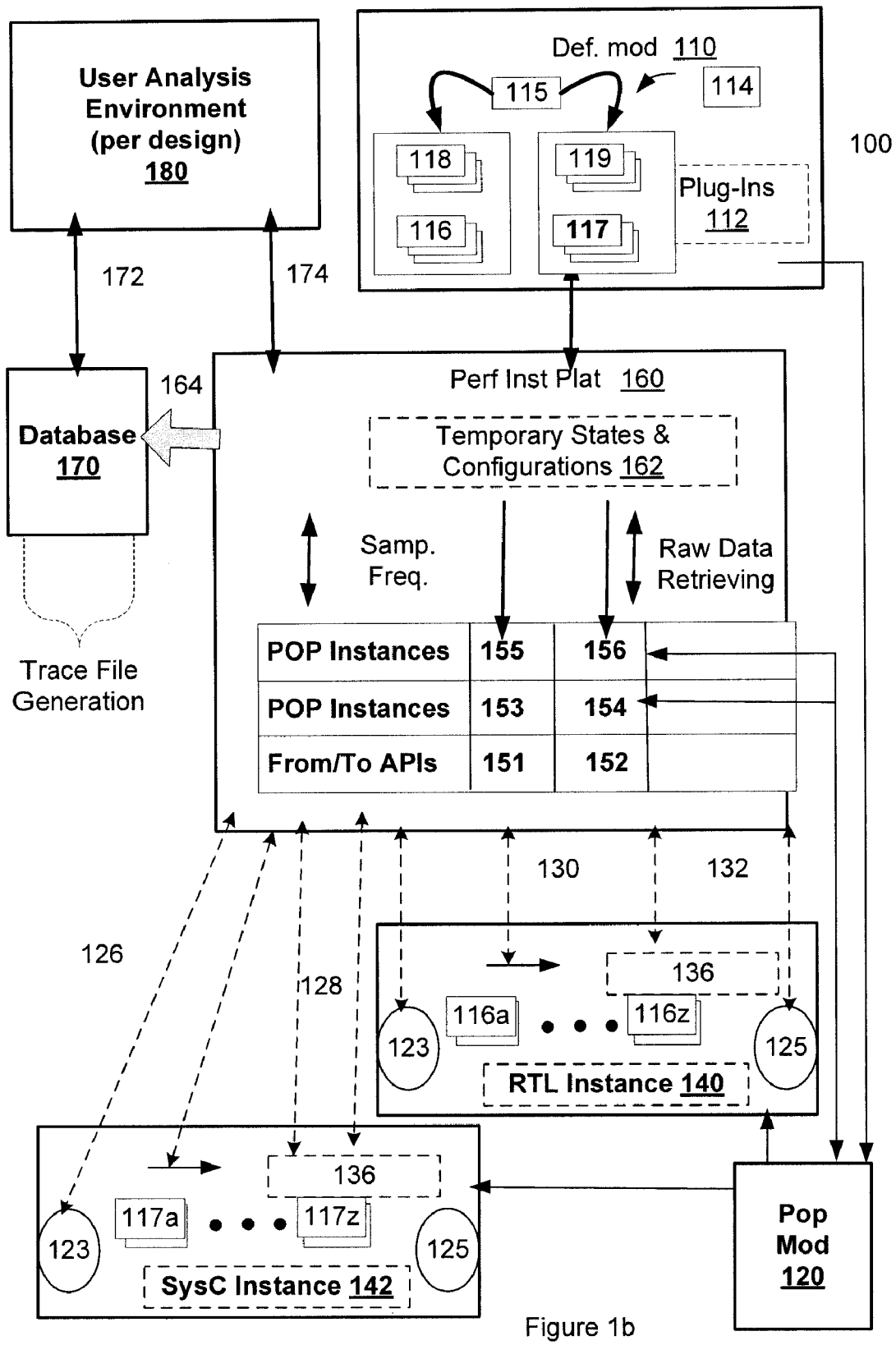
FIG. 1b illustrates a block diagram of another embodiment of an electronic design automation (EDA) modeling tool for performing performance instrumentation and analysis for an electronic system.

FIG. 1b illustrates a block diagram of another embodiment of an electronic design automation (EDA) modeling tool for performing performance instrumentation and analysis for an electronic system.

The population module 120 instruments the first set of intended software instrumentation test points 116 in the first model 140 prior to, or during the run time of the first simulation. The population module 120 instruments the second set of intended software instrumentation test points 117 in the second model 142 prior to, or during the run time of the second simulation.

The performance instrumentation platform 160 creates a first set of software objects 153 associated with an enabled subset of the first set of intended software instrumentation test points 116 during run time of the first simulation. The performance instrumentation platform 160 creates a second set of software objects 154 associated with an enabled subset of the second set of intended software instrumentation test points 117 during run time of the second simulation. Various logical links 126, 128, 130, and 132 allow communication between the first model 140 and application programming interfaces (API) 151 and 152. The logical links 126, 128, 130, and 132 also allow communication between the second model 142 and the APIs 151 and 152. A logical link may be a functional call to/from the APIs. In one embodiment, the API 151 is a SystemC API and the API 152 is a RTL API. Each model 140, 142 (e.g., RTL model, SystemC model) receives inputs signals via the input interface 123. Each model 140, 142 sends outputs signals via the output interface 125. Each model 140, 142 may include a hardware performance counter 136 to analyze test point input signals and interface with APIs 151 and 152. In one embodiment, a single creation layer corresponds to each population module 120.

The performance instrumentation platform 160 manages the software objects 153 and associated instrumentation test points 116a-116z of the first executable behavioral model 140 and the software objects 154 and associated instrumentation test points 117a-117z of the second executable behavioral model 142 by enabling and disabling some or all of the first and second set of test points 116 and 117 based on a given instance of that electronic system either prior to, or during the runtime of the simulation. User control for enabling and disabling the test points is provided by means of the user analysis environment 180.

The performance instrumentation platform 160 also determines if the electronic system is functioning properly during run time of the first and second simulations. A deadlock situation in which a simulation is not able to proceed any further can be avoided based on the performance instrumentation platform 160 determining a cause of the deadlock situation. The performance instrumentation platform 160 includes temporary states and configurations 162 for managing software objects. The performance instrumentation platform 160 retrieves raw data via a logical link from the execution of the software objects 153 and 154 during run time of the first and second simulations. The performance instrumentation platform 160 samples the raw data at a certain frequency via a logical link.

In one embodiment, the first executable behavioral model 140 is a SystemC model and the second executable behavioral model 142 is a RTL model. The first set of software objects 153 will not be synthesized by a logic synthesis tool if associated with the SystemC model 140 which is a high level abstraction model. The second set of software objects 154 may be configured to be coded at a lower abstraction level in register transfer level (RTL) to be synthesized by the logic synthesis tool. Alternatively, the second set of software objects 154 may be configured to be coded at an abstraction level in register transfer level (RTL) without being synthesized by the logic synthesis tool.

The EDA modeling tool 100 further includes a recording database 170 that receives data from the performance instrumentation platform 160 via logical link 164. A user analysis environment 180 interfaces with the recording database 170 via a logical link 172. The user analysis environment 180 interfaces with the performance instrumentation platform 160 via a logical link 174.

In certain embodiments of the present disclosure, the EDA modeling tool 100 further includes a first and a second set of performance analysis units 118 and 119 associated with the first and second set of test points 116 and 117, respectively. The performance analysis units 118 and 119 perform calculations on raw data collected by the test points 116 and 117 during run time of the first and second simulations. Thus, the performance analysis units 118 and 119 reduce the amount of raw data to be sent to the database 170 leading to quicker feedback and debugging of the electronic system.

The definition module 110 defines the first and the second set of test points 116 and 117 and the associated first and the second set of performance analysis units 118 and 119 prior to run time of the first and second simulations. In a similar manner, the population module 120 instruments the first set of test points 116 and the associated first set of performance analysis units 118 to the first model 140 and instruments the second set of test points 117 and associated second set of performance analysis units 119 to the second model 142 prior to run time of the first and second simulations.

The performance instrumentation platform 160 may create both the first set of software objects 153 associated with an enabled subset of the first set of intended software instrumentation test points 116 and a first set of software objects 155 associated with an enabled subset of the first set of performance analysis units 118 during run time of the first simulation. The performance instrumentation platform 160 may create both the second set of software objects 154 associated with an enabled subset of the second set of intended software instrumentation test points 117 and a second set of software objects 156 associated with an enabled subset of the second set of performance analysis units 119 during run time of the second simulation.

The performance instrumentation platform 160 manages the software objects 153-156 and associated instrumentation test points 116-119 by enabling and disabling the first and second set of test points 116-119 based on a given instance of the electronic system. The performance analysis units are further described in connection with FIGS. 6-9.

The definition module 110, population module 120, and the performance instrumentation platform 160 in combination form a component object model based performance instrumentation infrastructure that is configured for use with any type of instrumented module in current use or available in the future. The performance instrumentation infrastructure can greatly reduce the design cycle by capturing interesting observations and executing analysis algorithms to help identify key performance bottlenecks.

Figure 2:
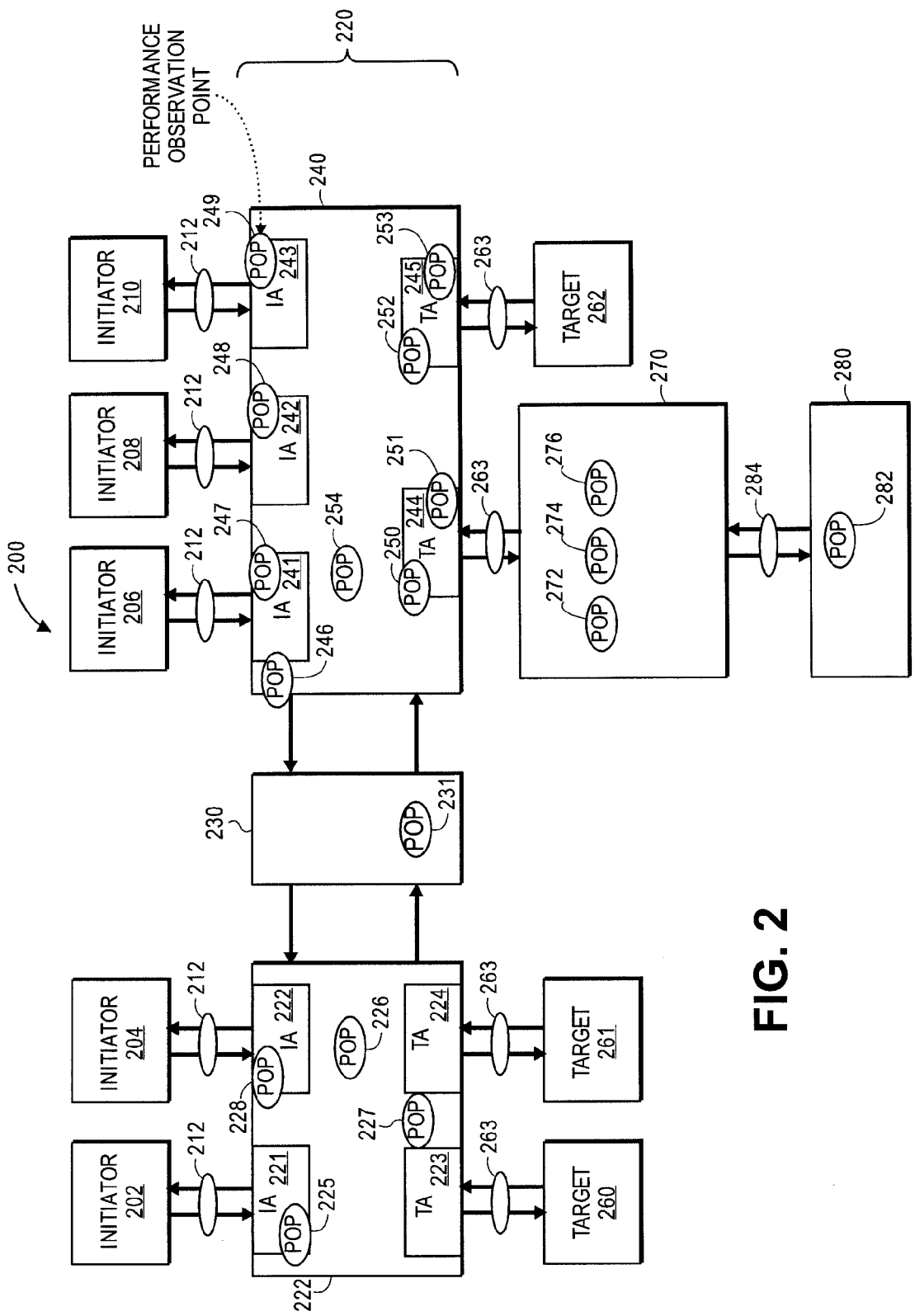
FIG. 2 illustrates a block diagram of an embodiment of an electronic system with software instrumentation test points.

FIG. 2 illustrates a block diagram of an embodiment of an electronic system with software instrumentation test points. The electronic system 200 includes a plurality of initiators 202, 204, 206, 208, and 210 that issue, send, or originate transactions between these initiators and at least one of the targets 260-262 and/or memory scheduler 270. An interconnect 220 includes blocks 222, 230, and 240 in order to transfer the transactions between initiators and targets. Initiators interface with the interconnect 220 via various interfaces 212. Targets interface with the interconnect 220 via various interfaces 263.

The electronic system 200 further includes the memory scheduler 270 and memory controller 280 for accessing and storing data associated with an off chip memory component (not shown) such as dynamic random access memory (DRAM). The interconnect 220, memory scheduler 270, and memory controller 280 may include software instrumentation test points (e.g., performance observation points (POP)) that collect data associated with the various transactions. A test point or POP is a software object that provides visibility to a specific event related to transactions and resources. In one embodiment, each event gets logged in a defined format such as in an ASCII file using SCV (SystemC Verification library) transaction recording.

In one embodiment, block 222 includes initiator agents 221 and 222, target agents 223 and 224, and test points 225, 226, 227, and 228. Block 230 includes test point 231. Block 240 includes initiator agents 241, 242, and 243, target agents 244 and 245, and test points 246-254.

A simulation based on a SystemC model can be performed on the electronic system 200. The SystemC model provides a detailed instrumentation and high simulation speed with the quality of the analysis results depending on the SystemC model accuracy. The SystemC model provides transaction tracing from initiator to target across the interconnect 220. Performance measurements include end to end times of a given transaction, round trip latencies, average/peak/best performance figures over a certain time window, internal model measurements, analysis of queues (e.g., occupancy, size), quality of service (QoS) tracing, thread arbitration, link arbitration, comparison of multiple simulations, and other similar performance metrics.

The basic instrumentation based on test points as illustrated in FIG. 2 captures detailed activity found in the interconnect 220. A large amount of information is sent to the SCV analysis output file. A large analysis database with full post processing capability can perform the analysis, which is ideal for early exploration or system debug.

Figure 3:
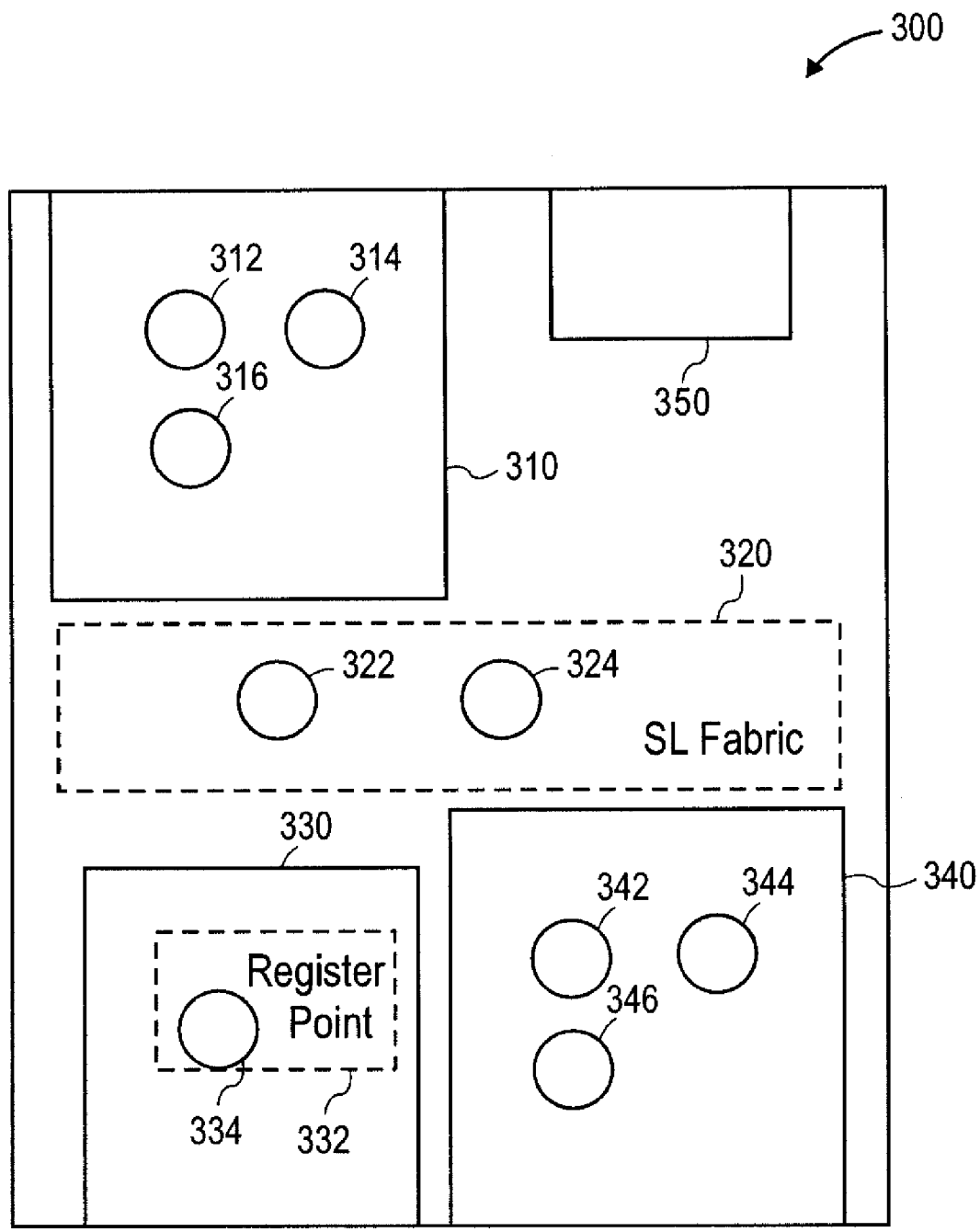
FIG. 3 illustrates a block diagram of an embodiment of an interconnect of an electronic system with the interconnect having software instrumentation test points.

FIG. 3 illustrates a block diagram of an embodiment of an interconnect of an electronic system with the interconnect having software instrumentation test points. The interconnect 300 includes initiator agents 310 and 350, target agents 330 and 340, a shared link fabric 320, and software instrumentation test points 312, 314, 316, 322, 324, 334, 342, 344, and 346. The test point 334 is associated with a register point 332 for collecting measurements recorded by the test point 334.

An instrumentation test point inserted inside the interconnect 300 allows performance related activities observable by the test point to be monitored. Raw performance data represents observed activities at each test point during a simulation of an electronic system can also be collected to a transaction-based database (e.g., SCV) that allows post-process analysis.

FIG. 3 illustrates the concept of a instrumented instance where some of the defined test points available to a particular architecture are enabled—for instance, 10 test points are enabled for the design. In one embodiment, each test point is associated with an intended hardware entity that may become synthesized or remain as an intended hardware entity. Test point 312 if configured and enabled can be associated with a request resource (e.g., buffer, register, flip flop) and monitors this resource. Test point 314 if configured and enabled can be associated with a response resource (e.g., buffer, register, flip flop) and monitors this resource. Test point 316 if configured and enabled can be associated with a maximum burst limitation that blocks requests of the initiator agent 310 that exceed the maximum burst limitation. Test point 322 if configured and enabled can be associated with a request link limitation that determines if a request link of the shared link fabric 320 is occupied. Test point 334 if configured and enabled can be associated with a buffer resource (e.g., FIFO buffer, register, flip flop) and monitors the occupancy and other parameters of this resource.

Figure 4A:
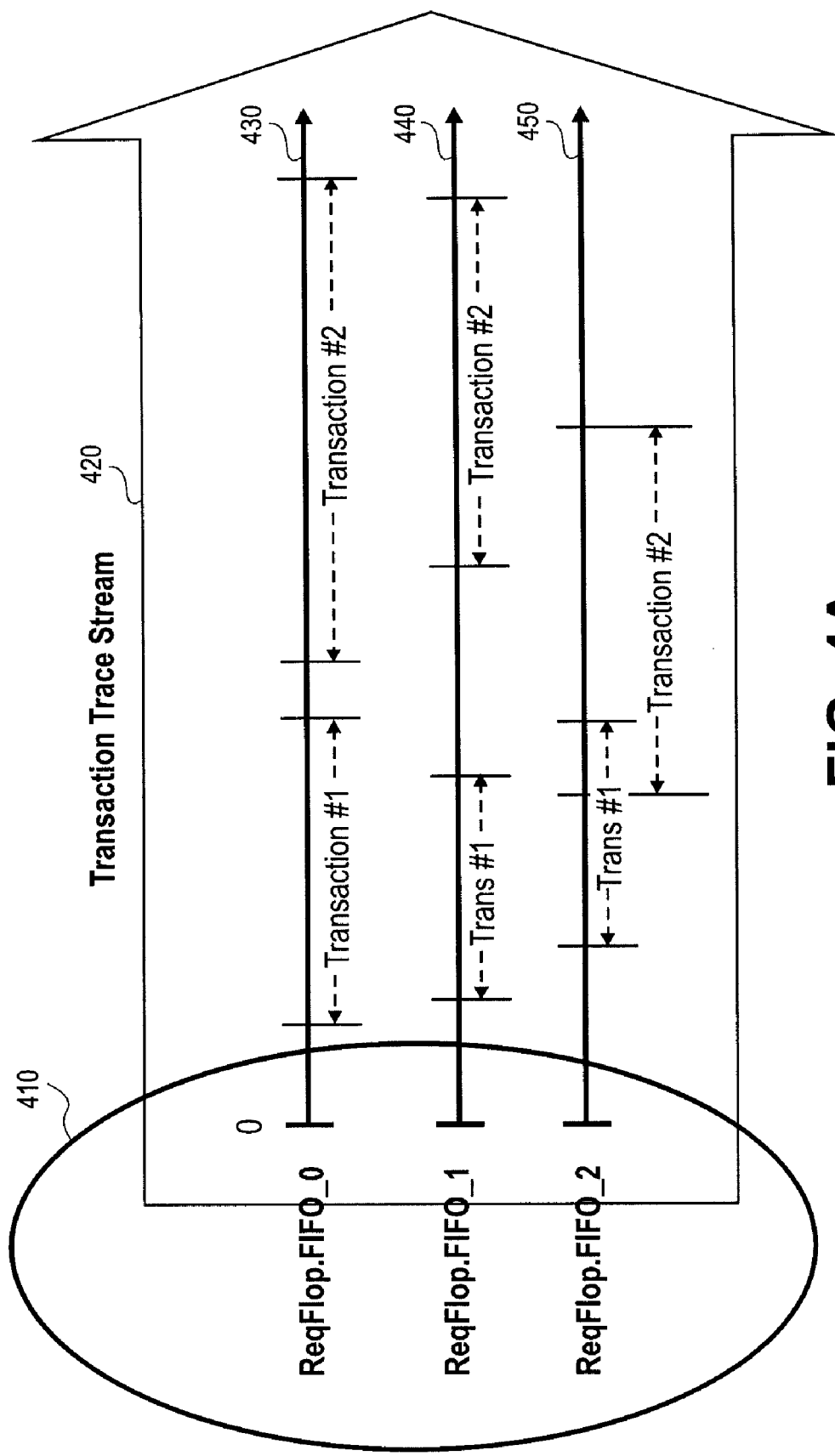
FIG. 4a illustrates an embodiment of a transaction trace stream having trace lines associated with a software instrumentation test point.

FIG. 4a illustrates an embodiment of a transaction trace stream having trace lines associated with a software instrumentation test point. The transaction trace stream 420 is associated with the software instrumentation test point 410 and represents raw performance data collected at the test point 410 during simulation. If a SCV library is used for generating the raw performance data's database, a SCV transaction stream (e.g., scv_tr_stream) is created as the transaction trace stream of the test point 410. The transaction trace stream 420 includes transaction generator trace lines 430, 440, and 450 which correspond to and monitor activities (e.g., transaction #1, transaction #2) associated with request resources and test point variables such as ReqFlop.FIFO_0, ReqFlop.FIFO_1, and ReqFlop.FIFO_2, respectively, with ReqFlop being a type of request resource and FIFO_0, FIFO_1, and FIFO_2 being test point variables.

Each test point contains one or more test point variables that are configured based on a design's configuration. For example, the design may be configured with the test point 410 being located on an initiator agent to monitor activities with respect to the usages of all request-side resources (e.g., FIFO queues).

In one embodiment, a number N of test point variable(s) for the test point equals the number of initiator threads. Each test point variable "FIFO_n", where n can be ranged from 0 to the number of initiator threads −1, is used to monitor the nth FIFO queue associated with the initiator thread n. When the initiator threads are collapsed, only one test point variable, FIFO_0, is available to monitor activities of the collapsed FIFO queue.

Depending on configurations, in FIG. 3, the initiator agent 310 may have three threads and the target agent 330 may be configured with merely one thread for the design. Therefore, the test point 312 may have three test point variables, FIFO_0, FIFO_1, and FIFO_2 that each monitor a FIFO queue; and the test point 334 may have one test point variable, FIFO_0. This "multi-variable test point" concept facilitates the configuration flexibility.

Returning to FIG. 4A, the three test point variables for test point 410 are the FIFO_0, FIFO_1, and FIFO_2. Since a test point can have multiple variables, a transaction trace stream can contain multiple transaction trace lines. Activities (i.e., events) associated with each test point variable are monitored in a transaction-by-transaction fashion and can be collected during simulation along the variable's trace line. Raw performance data that represents or corresponds to activities (i.e., events) of each transaction needs to be defined by an architect of the interconnect 300.

Figure 4B:
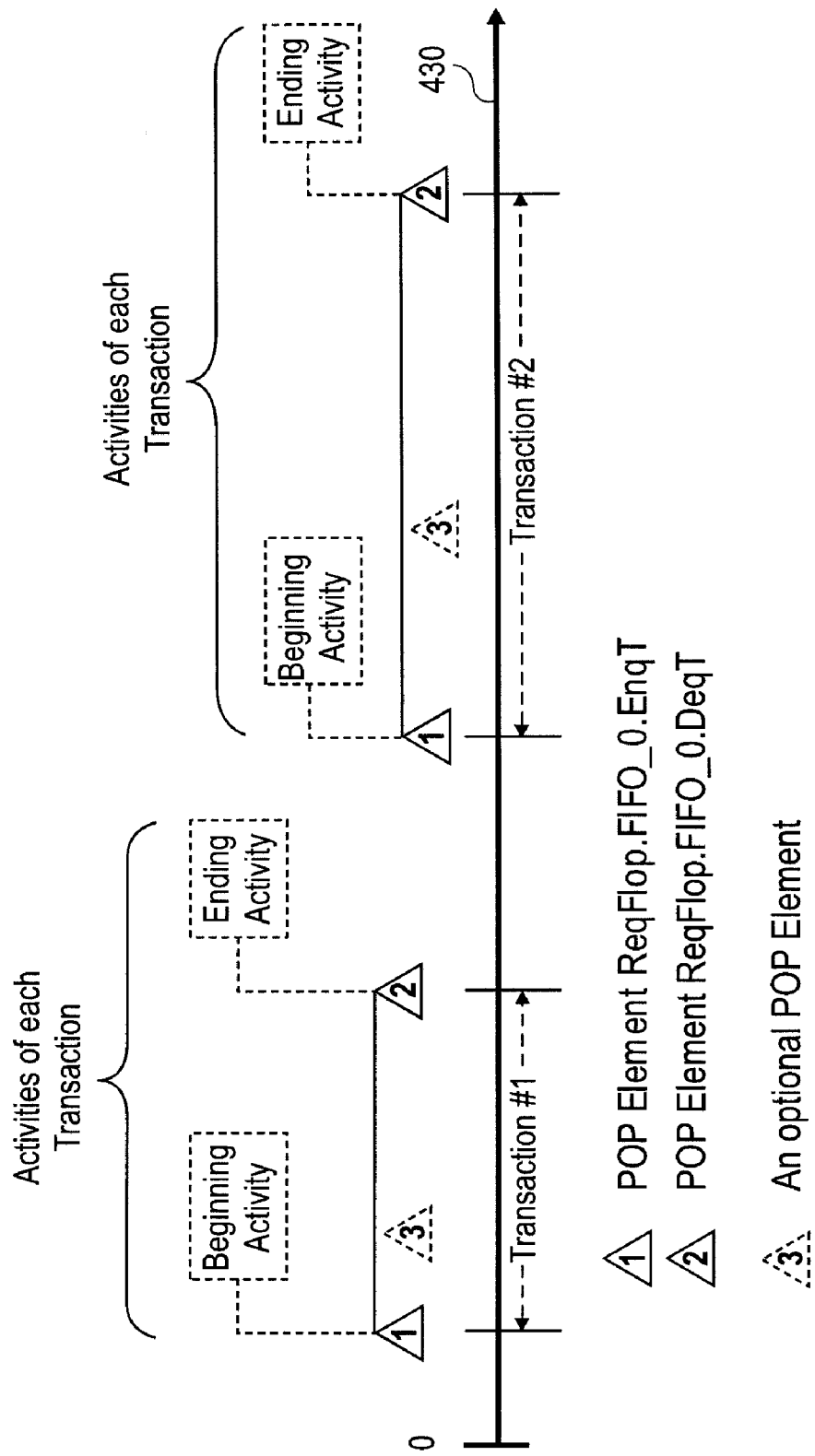
FIG. 4b illustrates, as an example, an embodiment of a trace line with multiple test point elements associated with a test point variable.

Each test point variable can have one or more test point elements that are used to store the transaction-based raw performance data collected during the run time of the simulation. An architect defines the semantics of each of the test point elements associated with its test point variable. In a transaction-based tracing scheme, two activities, a beginning one and an ending one, may be used to identify a transaction. Optional activities along the time line between the beginning and ending of a transaction can be defined, if needed. FIG. 4b illustrates, as an example, an embodiment of a trace line with multiple test point elements associated with a test point variable. In one embodiment, "EnqT" and "DeqT" are test point elements defined for test point variable "ReqFlop.FIFO_0" where "EnqT" and "DeqT" represent the beginning and ending, respectively, of each transaction.

FIG. 4b also shows two transactions associated with FIFO_0 and recorded on the transaction trace line 430. Transactions can overlap with one another, but this effect is not shown in FIG. 4b. When transaction overlapping is possible, each test point element may need to use a software FIFO data structure to store values of all outstanding transactions—the transactions can be freed once being used.

The architectural semantic of the test point elements can be as follows. Test point Element "EnqT" means the en-queuing time when a free buffer entry of the req_flop "FIFO_0" queue is consumed taking into account the width conversion—this can due to the acceptance of a new initiator packet. Test point element "DeqT" is defined as the de-queuing time when the req_flop "FIFO_0" queue is freeing up one buffer entry taking into account the width conversion—this can due to the departure of a packet down to the SL fabric 320.

In addition to use the above test point elements to monitor activities, additional information such as the packet's identification can also be collected along those activities using other test point elements. When the SCV library is used, the SCV transaction generator's begin_transaction( ), end_transaction( ), and the SCV transaction generator handler's record_attribute( ) API functions can be used to generate (i.e., record) transactions along each trace line for each transaction.

Figure 5:
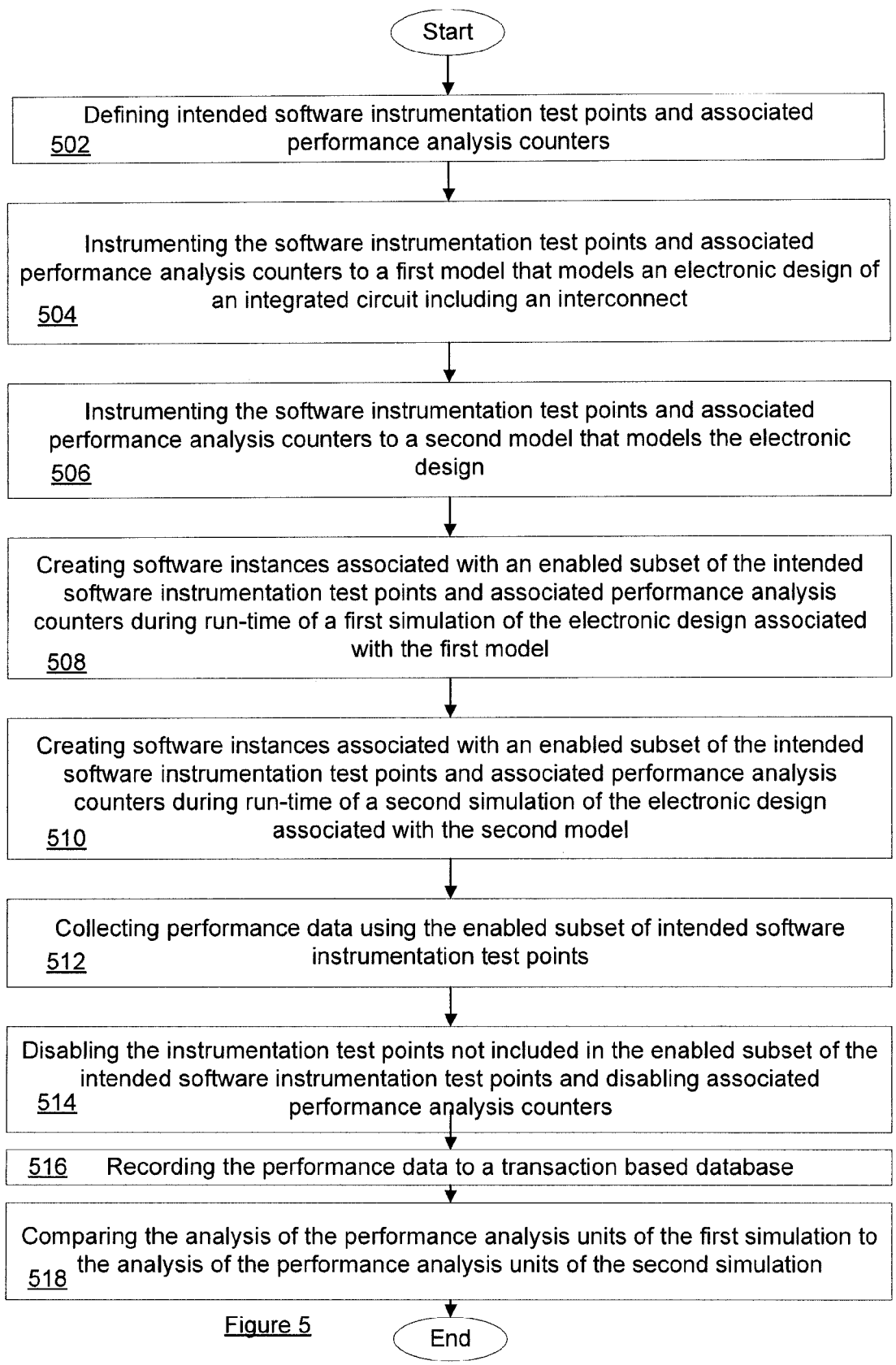
FIG. 5 illustrates a flow chart of an embodiment of providing performance instrumentation and analysis of an electronic design.

FIG. 5 illustrates a flow chart of an embodiment of providing performance instrumentation and analysis of an electronic design. A method for providing performance instrumentation and analysis includes defining intended software instrumentation test points at block 502. The method further includes instrumenting the software instrumentation test points to a first executable behavioral model having a first level of abstraction at block 504. The first model models an electronic system of an integrated circuit including an interconnect. The method further includes instrumenting the software instrumentation test points to a second executable behavioral model having a second level of abstraction at block 506. The second model models the electronic system. The method further includes creating software objects associated with an enabled subset of the intended software instrumentation test points during run time of a first simulation of the electronic system associated with the first executable behavioral model at block 508. The method further includes creating software objects associated with an enabled subset of the intended software instrumentation test points during run time of a second simulation of the electronic system associated with the second executable behavioral model at block 510.

In one embodiment, the method further includes collecting performance data using the enabled subset of intended software instrumentation test points at block 512. The method further includes disabling the instrumentation test points not included in the enabled subset of the intended software instrumentation test points at block 514. The method further includes recording the performance data to a transaction-based database at block 516. The method may later compare the similar measurement quantities between the enabled subsets of software instrumentation points to discern differences in the executable behavioral models coded at different levels of abstraction.

Figure 6:
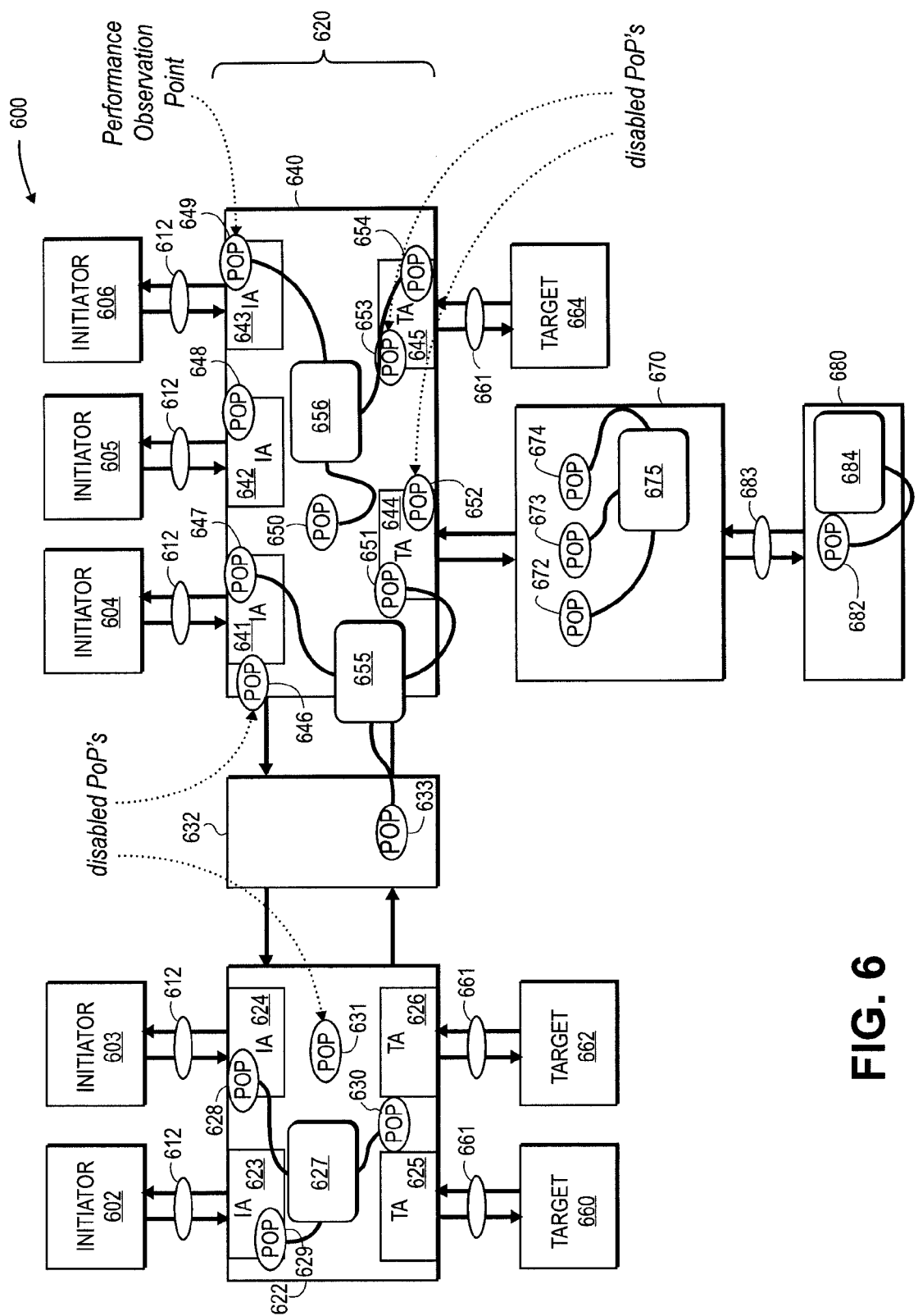
FIG. 6 illustrates a block diagram of an embodiment of an electronic system with software instrumentation test points and performance analysis units.

FIG. 6 illustrates a block diagram of an embodiment of an electronic system with software instrumentation test points and performance analysis units. The electronic system 600 includes similar components (e.g., initiators 602-606, initiator agents 623, 624, 641-643, targets 660, 662, 664, target agents 625, 626, 644, 645, interconnect 620, shared link 622, components 632, 640, 670, 680, interfaces 612, 661, 683, and test points 628-631, 633, 646-654, 672-674, and 682) as compared to the electronic system 200 previously discussed. However, FIG. 6 illustrates advanced instrumentation that includes both test points and associated performance analysis units 627, 655, 656, 675, and 684 (e.g., counters).

A performance analysis unit is a software object in run time processing that performs analysis on data collected one or more associated the test points in order to optimize simulation speed and minimize analysis database size. For example, performance analysis unit 627 is associated with enabled test points 628-630 that collect data associated with transactions occurring across the block 622. The performance analysis unit 627 performs analysis of this collected data during run time of a simulation associated with the electronic system 600 in order to quickly monitor, debug, and analyze performance of the electronic system.

In one embodiment, each performance analysis unit performs analysis on a filtered specific dataflow. A filtered data flow may originate from initiator 606, on thread 2 with a specific address range. Each performance unit is triggered on a specific event. For an OCP based transaction, the performance unit starts measuring performance parameters on a particular register access (e.g., end of the boot sequence, core initialization, beginning of DMA transfers).

Figure 7:
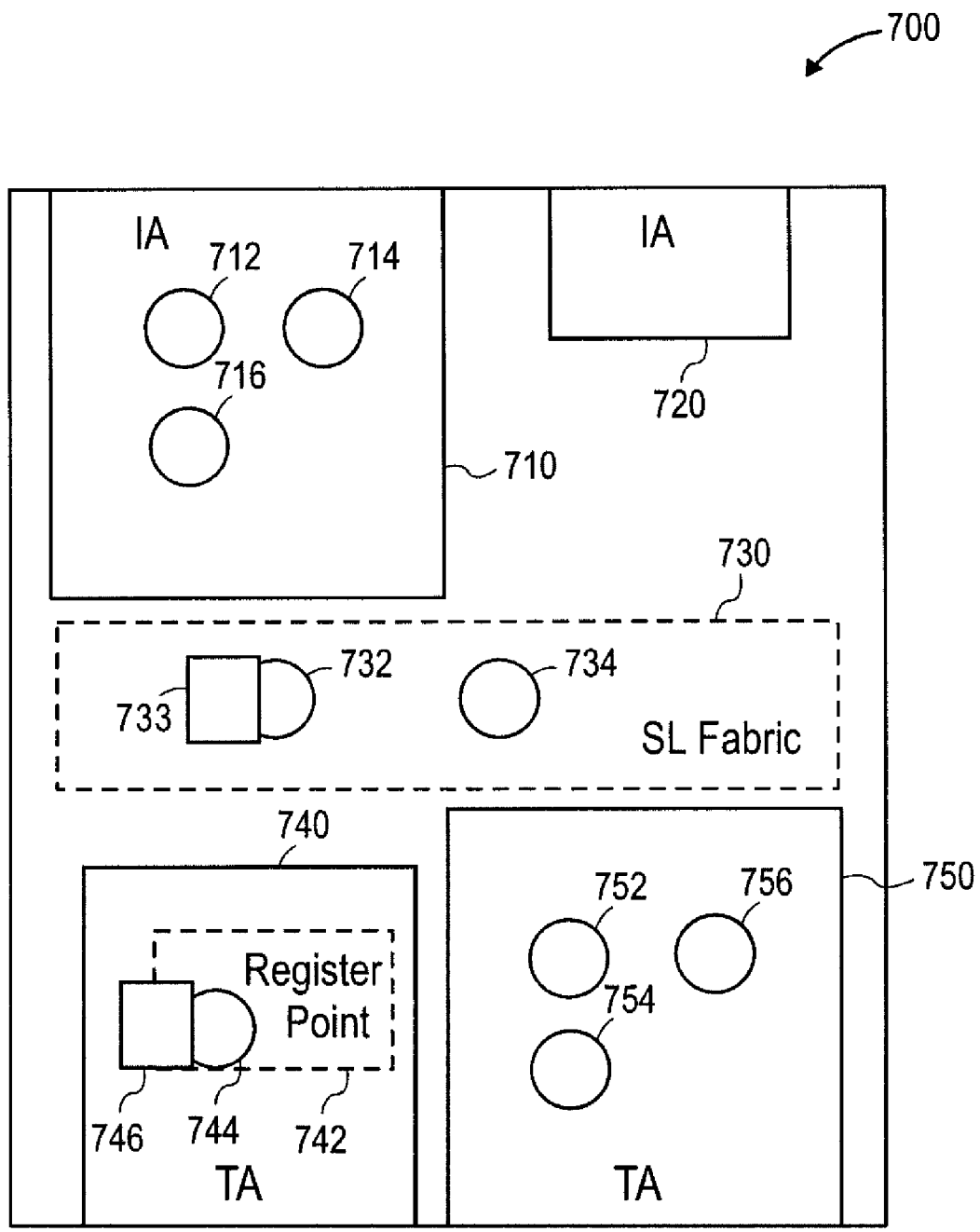
FIG. 7 illustrates a block diagram of an embodiment of an interconnect with software instrumentation test points and performance analysis units.

FIG. 7 illustrates a block diagram of an embodiment of an interconnect with software instrumentation test points and performance analysis units. The interconnect 700 includes initiator agents 710 and 720, target agents 740 and 750, a shared link fabric 730, software instrumentation test points 712, 714, 716, 732, 734, 744, 752, 754, and 756. The test point 744 is associated with a register point 742 for collecting measurements recorded by the test point 744.

A performance analysis unit or performance analysis counter is a software instrumentation instance that can be attached to one or more test points inside a populated and enable subset, and thus, instrumented instance. FIG. 7 illustrates this concept by showing that two defined performance analysis counters 733 and 746 available for the interconnect 700 design, are attached to test points 732 and 744, respectively.

Each performance analysis unit allows performance related activities to be monitored and/or collected by its attaching instrumentation test point(s) and to be further analyzed during simulation time. The analysis algorithm used by each performance analysis unit can: (1) utilize the configuration information (e.g., the maximum queue size of a FIFO) associated with the test point location; (2) use as inputs of the simulation time, the current counter value of a performance analysis unit, and the stored values of all test point elements of interested from the attaching instrumentation test point(s)—merely the oldest value of each POP element associated with the same (and the oldest) transaction can be used; and (3) after the computation, save the result as the new counter value for future usage.

In one embodiment, a performance analysis unit includes at least one simple, defined analysis algorithm as follows. An average performance analysis unit can be used to compute the average value of interest during a period of time. A count performance analysis unit can be used to count the occurrences of interest during a period of time. A utilization performance analysis unit can be used to calculate the utilization of interest during a period of time. The maximum dimension of the resource of interest must be provided while initializing the counter instance.

Other examples for a performance analysis unit or counter include the following. A transaction performance analysis counter can be used to obtain statistics at a per-transaction basis, including start-time, end-time, request path latency, response path latency, end-to-end latency, and page-hit/miss statistics. An arbitration performance analysis counter can be used to monitor a thread level parallelism in a simulation. Thread level parallelism is a per cycle measure of the number of threads that are contending for a resource in an arbitration unit. The number of threads active at different part of the simulation can vary. There might be times in a simulation when only one thread is active. Other times, multiple threads may be active. And other times, no thread might be active. A measure of how many threads are available for an arbitration unit to choose from has an effect on the performance on the interconnect. A deadlock performance analysis unit can be used to raise a flag if a deadlock was detected in the system. The performance analysis units can include an average performance analysis unit to compute the average value of interest during a period of time, a count performance analysis unit to count the occurrences of interest during a period of time, and a utilization performance analysis unit counter to calculate the utilization of interest during a period of time.

In another embodiment, the underlying hardware components may have their own hardware counters that are capable of analyzing usages of some critical resources not just during simulation but also the real use of the final product. In this case, a performance analysis unit software instance is not associated with each hardware component. Instead, a POP can be used to monitor each hardware counter's value directly.

Referring to FIG. 7, conceptually, the analysis algorithm for a performance analysis unit can be invoked when all inputs used by the algorithm become available. This also indicates that the availability of the last (in terms of simulation time, the collecting time) POP element of interest is used as the trigger. The algorithm associated with performance analysis unit 746 is triggered upon receiving collected data from the test point 744.

One advantage in using a performance analysis unit, instead of doing post-process analysis, is to allow a long simulation run with minimum file input/output (I/O) and to do useful performance analysis on the fly. Therefore, the simulation can run much faster (due to less file I/O) and can generate only a small database containing not the raw performance data but the final, analyzed performance results out of all performance analysis units The analysis results of a performance analysis unit is computed during simulation time and saved as the counter value from time to time after every computation. In some cases, the history (i.e., the usage characteristic) of a performance analysis unit can be more important than the final counter result. Thus, it is also important to provide a way to collect the counter value from time to time. The sampling scheme introduced below in FIG. 8 allows the counter value of each performance analysis unit to be retrieved and recorded (to the database) periodically.

Figure 8:
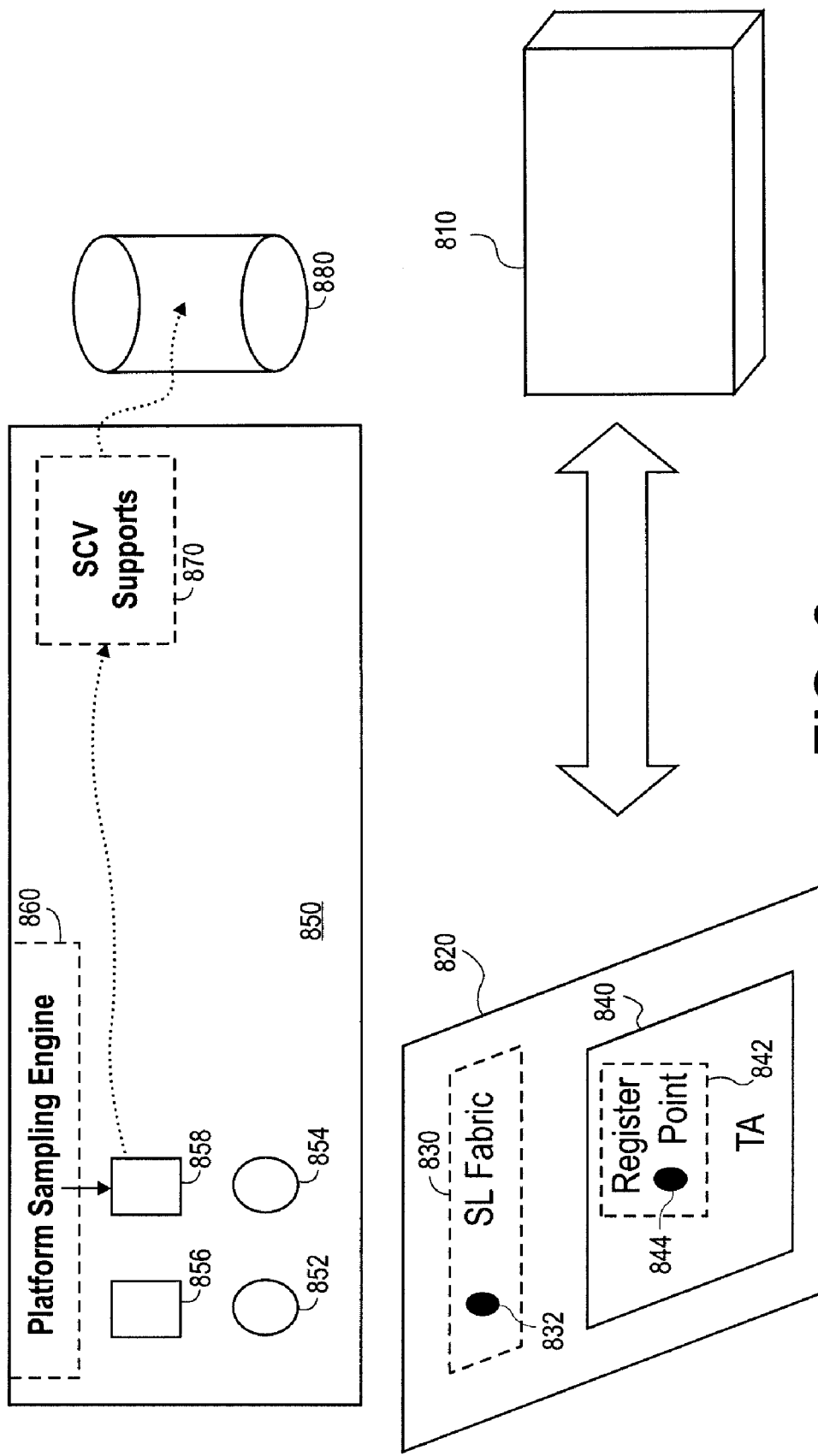
FIG. 8 illustrates a block diagram of an embodiment of a sampling scheme for providing performance instrumentation and analysis of an electronic design.

FIG. 8 illustrates a block diagram of an embodiment of a sampling scheme for providing performance instrumentation and analysis of an electronic design. The performance instrumentation and analysis library 850 is responsible for sampling each performance analysis unit instance 856 and 858 with a given sampling rate (can be changed during simulation time). Each instance 856 and 858 is associated with a test point instance 852 and 854 that corresponds to test points 832 and 844 located on an interconnect 820. The interconnect 820 includes a shared link fabric 830, target agent 840, and register point 842. A reference manual 810 provides definitions for the test points and performance analysis units.

In one embodiment, when a performance analysis unit (e.g., counter) is sampled by the library's Platform Sampling Engine 860, it picks up the counter content and dumps both the simulation time and the counter content or other specified data to a transaction trace line associated with this performance analysis unit. The sampling rate can be adjusted according to the length of a simulation run so that the generated counter trace is small and will not significantly affect the simulation time.

In some embodiments, we have one transaction trace stream for the Platform Sampling Engine 860 with the stream including multiple transaction trace lines, one for each performance analysis unit to reduce software overhead. Before the end of the simulation, values stored in all performance analysis units are recorded to the database 880 via the support block 870 that performs formatting. This may assist in post processing analysis.

The available test points and performance analysis units for each interconnect are defined by an architect first, then, instrumented, by taking configuration into account, into the SystemC and RTL modules accordingly. instrumented code is merely used during simulation time.

Table 1 shows the initial set of POPs defined for an example architecture. The right-most three columns indicate whether a POP is expected to be instrumented to the specified product entity, i.e., the RTL module, the SystemC TL1 model, and the SystemC TL2+ model.

TABLE 1

Initial POPs

| POP Name @ Location | Definitions for the POP, its POP Variables, and its POP Elements | RTL | SysC TL1 | SysC TL2+ |
|---|---|---|---|---|
| ReqFlop @ IA | Monitor the usage of the req_flop resource taking into account possible width conversion. Variables FIFO_{0 to threads − 1}: Each variable is used to monitor its corresponding thread's FIFO activities. Element EnqT: represents when one FIFO entry is consumed. It identifies the beginning of a transaction. Element DeqT: represents when one FIFO entry is freed. It identifies the ending of a transaction. | Yes | Yes | N/A |
| RespFlop @ IA | Monitor the usage of the resp_flop resource taking into account possible width conversion. Variables FIFO_{0 to threads − 1}: Each variable is used to monitor its corresponding thread's FIFO activities. Element EnqT: represents when one FIFO entry is consumed. It identifies the beginning of a transaction. Element DeqT: represents when one FIFO entry is freed. It identifies the ending of a transaction. | Yes | Yes | Yes |
| MaxBurst @ IA | Monitor the blocking/unblocking of a request packet due to reaching the max_burst limit. Variables T_{0 to threads − 1}: Each variable is used to monitor its corresponding thread's blocking/unblocking activities. Element BlkT: represents when a packet is blocked. It identifies the beginning of a transaction. Element UnBlkT: represents when a blocked packet is unblocked. It identifies the ending of a transaction. | Yes | Yes | N/A |
| ReqLink @ SL | Monitor the request-side link usage of the SL fabric. Variables Busy: is used to monitor the busy cycles of the SL request link. Element StartT: represents when the link is occupied due to presenting (i.e., sending) a packet. It identifies the beginning of a transaction. Element DurationT: represents the cycle length between the presenting of a packet and its acceptance. It also identifies the ending of a transaction. | Yes | Yes | Yes |
| RespLink @ SL | Monitor the response-side link usage of the SL fabric. Variables Busy: is used to monitor the busy cycles of the SL response link. Element StartT: represents when the link is occupied due to presenting (i.e., sending) a packet. It identifies the beginning of a transaction. Element DurationT: represents the cycle length between presenting of a packet and its acceptance. It also identifies the ending of a transaction. | Yes | Yes | Yes |
| ReqRegPnt @ IA register point, TA register | Monitor the buffer usage of each register point taking into account possible width conversion. Variables FIFO_{0 to threads − 1}: Each variable is used to monitor its | Yes | Yes | N/A |

TABLE 1-continued

Initial POPs

| POP Name @ Location | Definitions for the POP, its POP Variables, and its POP Elements | RTL | Instrumented in SysC TL1 | SysC TL2+ |
|---|---|---|---|---|
| point, or PP for the request network | corresponding SMX thread's FIFO activities. Element EnqT: represents when one FIFO entry is consumed. It identifies the beginning of a transaction. Element DeqT: represents when one FIFO entry is freed. It identifies the ending of a transaction. | | | |
| RespRegPnt @ IA register point, TA register point, or PP for the response network | Monitor the buffer usage of each register point taking into account possible width conversion. Variables FIFO_{0 to threads − 1}: Each variable is used to monitor its corresponding SMX thread's FIFO activities. Element EnqT: represents when one FIFO entry is consumed. It identifies the beginning of a transaction. Element DeqT: represents when one FIFO entry is freed. It identifies the ending of a transaction. | Yes | Yes | N/A |
| ReqFlop @ TA | Monitor the usage of the req_flop resource taking into account possible width conversion. Variables FIFO_{0 to threads − 1}: Each variable is used to monitor its corresponding thread's FIFO activities. Element EnqT: represents when one FIFO entry is consumed. It identifies the beginning of a transaction. Element DeqT: represents when one FIFO entry is freed. It identifies the ending of a transaction. | Yes | Yes | Yes |
| RespFlop @ TA | Monitor the usage of the resp_flop resource taking into account possible width conversion. Variables FIFO_{0 to threads − 1}: Each variable is used to monitor its corresponding thread's FIFO activities. Element EnqT: represents when one FIFO entry is consumed. It identifies the beginning of a transaction. Element DeqT: represents when one FIFO entry is freed. It identifies the ending of a transaction. | Yes | Yes | N/A |
| MaxBurst @ TA | Monitor the blocking/unblocking of a request packet due to reaching the max_burst limit. Variables T_{0 to threads − 1}: Each variable is used to monitor its corresponding thread's blocking/unblocking activities. Element BlkT: represents when a packet is blocked. Element UnBlkT: represents when a blocked packet is unblocked. | Yes | Yes | Yes |

Figure 9:
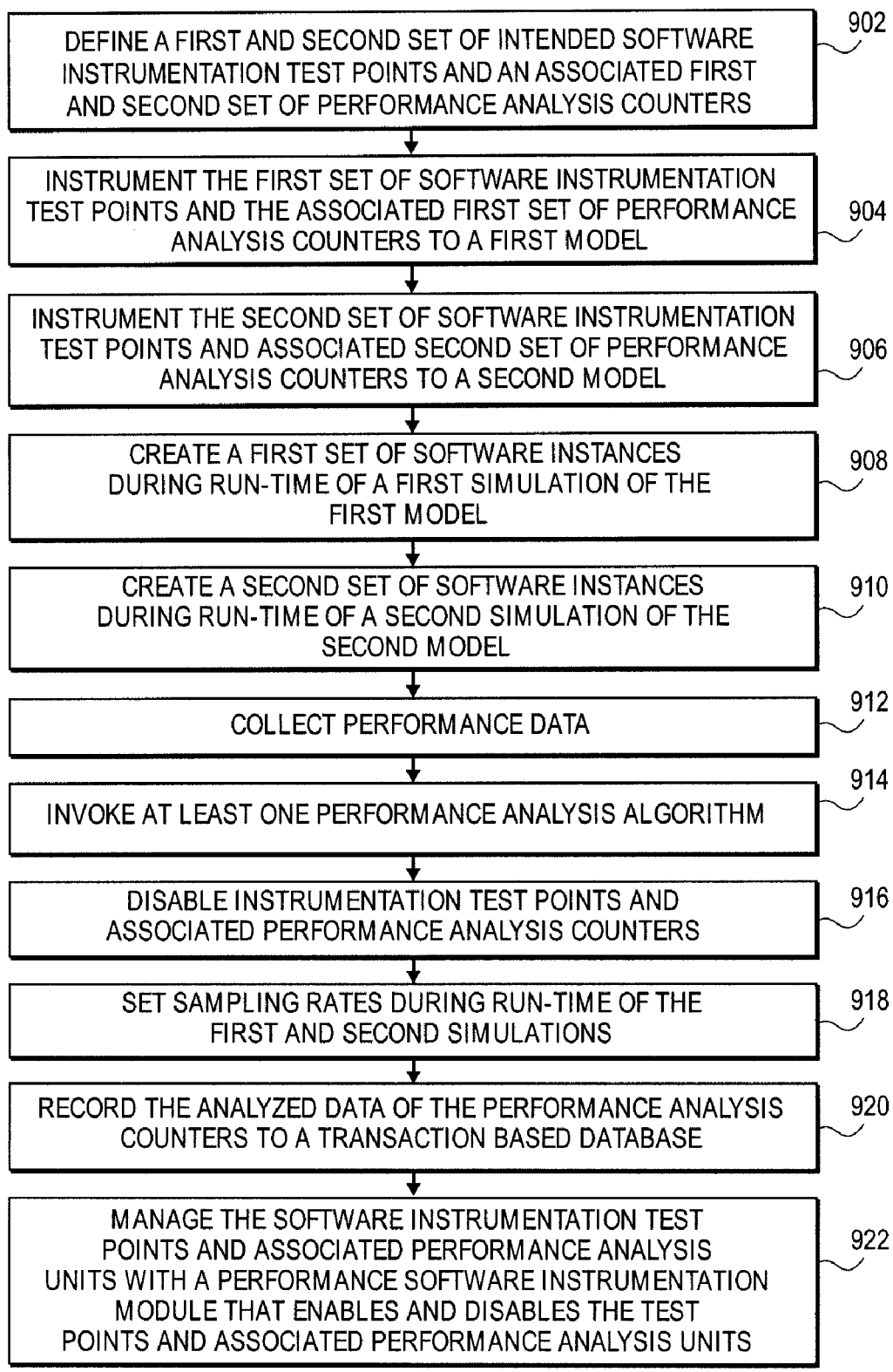
FIG. 9 illustrates a flow chart of another embodiment of providing performance instrumentation and analysis of an electronic design.

FIG. 9 illustrates a flow chart of another embodiment of providing performance instrumentation and analysis of an electronic design. A method for providing performance instrumentation and analysis of the electronic design includes defining a first and second set of intended software instrumentation test points and an associated first and second set of performance analysis units at block 902. The method further includes instrumenting the first set of software instrumentation test points and the associated first set of performance analysis units to a first model having a first level of abstraction that models an electronic design of an integrated circuit including an interconnect at block 904.

The method further includes instrumenting the second set of software instrumentation test points and associated second set of performance analysis units to a second model having a second level of abstraction that models the electronic design at block 906. The method further includes creating a first set of software instances associated with an enabled subset of the first set of intended software instrumentation test points and associated enabled subset of the first set of performance analysis units during run time of a first simulation of the electronic design associated with the first model at block 908. The method further includes creating a second set of software instances associated with an enabled subset of the second set of intended software instrumentation test points and associated enabled subset of the second set of performance analysis units during run time of a second simulation of the electronic design associated with the second model at block 910. The method further includes collecting performance data using the enabled subset of the first and second set of intended software instrumentation test points at block 912. The method further includes invoking at least one performance analysis algorithm installed in the performance analysis units when collected data from the associated instrumentation points becomes available to each performance analysis unit at block 914. The method further includes disabling the instrumentation test points not included in the enabled subset of the intended software instrumentation test points and disabling associated performance analysis units at block 916.

In one embodiment, the method further includes setting sampling rates for the enabled subset of the first and second set of intended software instrumentation test points and associated first and second set of performance analysis units during run time of the first and second simulations at block 918. The method further includes recording the analyzed data of the performance analysis units to a transaction-based database at block 920. The performance analysis units are configured with a plurality of performance analysis algorithms to analyze performance of the electronic design during run time of the first and second simulation and thus reduce the amount of data recorded to the transaction based database.

In some embodiments, the first set of software instrumentation test points and associated first set of performance analysis units of the first simulation correspond to the second set of software instrumentation test points and associated second set of performance analysis units of the second simulation.

The method further includes managing the first set of software instrumentation test points and associated first set of performance analysis units of the first executable behavioral model and the second set of software instrumentation test points and associated second set of performance analysis units of the second executable behavioral model with a performance software instrumentation module that enables and disables the first and second sets of test points and associated performance analysis units and determines if the electronic system is functioning properly during run time of the first and second simulations at block 922.

Figure 10:
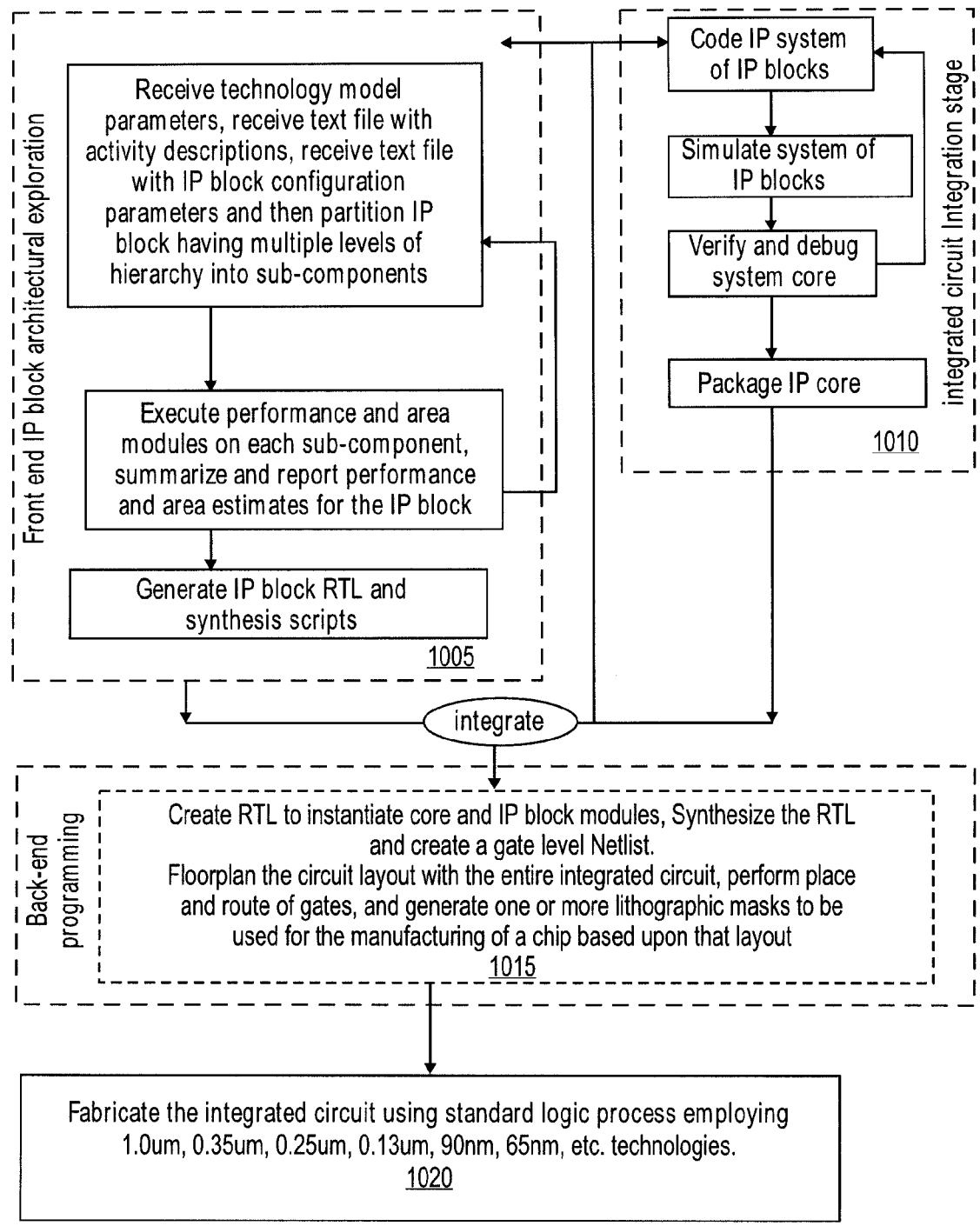
FIG. 10 illustrates a flow diagram of an embodiment of an example of a process for generating a device, such as a System on a Chip, with the designs and concepts discussed above for the interconnect.

FIG. 10 illustrates a flow diagram of an embodiment of an example of a process for generating a device, such as a System on a Chip, with the designs and concepts discussed above for the Interconnect of the device. The example process for generating a device from designs of the Interconnect may utilize an electronic circuit design generator, such as a System on a Chip compiler, to form part of an Electronic Design Automation (EDA) toolset. Hardware logic, coded software, and a combination of both may be used to implement the following design process operations using an embodiment of the EDA toolset. The EDA toolset such may be a single tool or a compilation of two or more discrete tools. The information representing the apparatuses and/or methods for the circuitry in the Interconnect, etc may be contained in an Instance such as in a cell library, soft instructions in an electronic circuit design generator, or similar machine-readable storage medium storing this information. The information representing the apparatuses and/or methods stored on the machine-readable storage medium may be used in the process of creating the apparatuses and/or methods described herein.

Aspects of the above design may be part of a software library containing a set of designs for components making up the Interconnect and associated parts. The library cells are developed in accordance with industry standards. The library of files containing design elements may be a stand-alone program by itself as well as part of the EDA toolset.

The EDA toolset may be used for making a highly configurable, scalable System-On-a-Chip (SOC) inter block communication system that integrally manages input and output data, control, debug and test flows, as well as other functions. In an embodiment, an example EDA toolset may comprise the following: a graphic user interface; a common set of processing elements; and a library of files containing design elements such as circuits, control logic, and cell arrays that define the EDA tool set. The EDA toolset may be one or more software programs comprised of multiple algorithms and designs for the purpose of generating a circuit design, testing the design, and/or placing the layout of the design in a space available on a target chip. The EDA toolset may include object code in a set of executable software programs. The set of application-specific algorithms and interfaces of the EDA toolset may be used by system integrated circuit (IC) integrators to rapidly create an individual IP core or an entire System of IP cores for a specific application. The EDA toolset provides timing diagrams, power and area aspects of each component and simulates with models coded to represent the components in order to run actual operation and configuration simulations. The EDA toolset may generate a Netlist and a layout targeted to fit in the space available on a target chip. The EDA toolset may also store the data representing the interconnect and logic circuitry on a machine-readable storage medium.

Generally, the EDA toolset is used in two major stages of SOC design: front-end processing and back-end programming.

Front-end processing includes the design and architecture stages, which includes design of the SOC schematic. The front-end processing may include connecting models, configuration of the design, simulating, testing, and tuning of the design during the architectural exploration. The design is typically simulated and tested. Front-end processing traditionally includes simulation of the circuits within the SOC and verification that they should work correctly. The tested and verified components then may be stored as part of a stand-alone library or part of the IP blocks on a chip. The front-end views support documentation, simulation, debugging, and testing.

In block 1005, the EDA tool set may receive a user-supplied text file having data describing configuration parameters and a design for at least part of an individual intellectual property (IP) block having multiple levels of hierarchy. The data may include one or more configuration parameters for that IP block. The IP block description may be an overall functionality of that IP block such as an interconnect. The configuration parameters for the interconnect IP block may be number of address regions in the system, system addresses, how data will be routed based on system addresses, etc.

The EDA tool set receives user-supplied implementation technology parameters such as the manufacturing process to implement component level fabrication of that IP block, an estimation of the size occupied by a cell in that technology, an operating voltage of the component level logic implemented in that technology, an average gate delay for standard cells in that technology, etc. The technology parameters describe an abstraction of the intended implementation technology. The user-supplied technology parameters may be a textual description or merely a value submitted in response to a known range of possibilities.

The EDA tool set may partition the IP block design by creating an abstract executable representation for each IP sub component making up the IP block design. The abstract executable representation models TAP characteristics for each IP sub component and mimics characteristics similar to those of the actual IP block design. A model may focus on one or more behavioral characteristics of that IP block. The EDA tool set executes models of parts or all of the IP block design. The EDA tool set summarizes and reports the results of the modeled behavioral characteristics of that IP block. The EDA tool set also may analyze an application's performance and allows the user to supply a new configuration of the IP block design or a functional description with new technology parameters. After the user is satisfied with the performance results of one of the iterations of the supplied configuration of the IP design parameters and the technology parameters run, the user may settle on the eventual IP core design with its associated technology parameters.

The EDA tool set integrates the results from the abstract executable representations with potentially additional information to generate the synthesis scripts for the IP block. The EDA tool set may supply the synthesis scripts to establish various performance and area goals for the IP block after the result of the overall performance and area estimates are presented to the user.

The EDA tool set may also generate an RTL file of that IP block design for logic synthesis based on the user supplied configuration parameters and implementation technology parameters. As discussed, the RTL file may be a high-level hardware description describing electronic circuits with a collection of registers, Boolean equations, control logic such as "if-then-else" statements, and complex event sequences.

In block 1010, a separate design path in an ASIC or SOC chip design is called the integration stage. The integration of the system of IP blocks may occur in parallel with the generation of the RTL file of the IP block and synthesis scripts for that IP block.

The EDA toolset may provide designs of circuits and logic gates to simulate and verify the operation of the design works correctly. The system designer codes the system of IP blocks to work together. The EDA tool set generates simulations of representations of the circuits described above that can be functionally tested, timing tested, debugged and validated. The EDA tool set simulates the system of IP block's behavior. The system designer verifies and debugs the system of IP blocks' behavior. The EDA tool set tool packages the IP core. A machine-readable storage medium may also store instructions for a test generation program to generate instructions for an external tester and the interconnect to run the test sequences for the tests described herein. One of ordinary skill in the art of electronic design automation knows that a design engineer creates and uses different representations to help generating tangible useful information and/or results. Many of these representations can be high-level (abstracted and with less details) or top-down views and can be used to help optimize an electronic design starting from the system level. In addition, a design process usually can be divided into phases and at the end of each phase, a tailor-made representation to the phase is usually generated as output and used as input by the next phase. Skilled engineers can make use of these representations and apply heuristic algorithms to improve the quality of the final results coming out of the final phase. These representations allow the electric design automation world to design circuits, test and verify circuits, derive lithographic mask from Netlists of circuit and other similar useful results.

In block 1015, next, system integration may occur in the integrated circuit design process. Back-end programming generally includes programming of the physical layout of the SOC such as placing and routing, or floor planning, of the circuit elements on the chip layout, as well as the routing of all metal lines between components. The back-end files, such as a layout, physical Library Exchange Format (LEF), etc. are generated for layout and fabrication.

The generated device layout may be integrated with the rest of the layout for the chip. A logic synthesis tool receives synthesis scripts for the IP core and the RTL design file of the IP cores. The logic synthesis tool also receives characteristics of logic gates used in the design from a cell library. RTL code may be generated to instantiate the SOC containing the system of IP blocks. The system of IP blocks with the fixed RTL and synthesis scripts may be simulated and verified. Synthesizing of the design with Register Transfer Level (RTL) may occur. The logic synthesis tool synthesizes the RTL design to create a gate level Netlist circuit design (i.e. a description of the individual transistors and logic gates making up all of the IP sub component blocks). The design may be outputted into a Netlist of one or more hardware design languages (HDL) such as Verilog, VHDL (Very-High-Speed Integrated Circuit Hardware Description Language) or SPICE (Simulation Program for Integrated Circuit Emphasis). A Netlist can also describe the connectivity of an electronic design such as the components included in the design, the attributes of each component and the interconnectivity amongst the components. The EDA tool set facilitates floor planning of components including adding of constraints for component placement in the space available on the chip such as XY coordinates on the chip, and routes metal connections for those components. The EDA tool set provides the information for lithographic masks to be generated from this representation of the IP core to transfer the circuit design onto a chip during manufacture, or other similar useful derivations of the circuits described above. Accordingly, back-end programming may further include the physical verification of the layout to verify that it is physically manufacturable and the resulting SOC will not have any function-preventing physical defects.

In block 1020, a fabrication facility may fabricate one or more chips with the signal generation circuit utilizing the lithographic masks generated from the EDA tool set's circuit design and layout. Fabrication facilities may use a standard CMOS logic process having minimum line widths such as 1.0 um, 0.50 um, 0.35 um, 0.25 um, 0.18 um, 0.13 um, 0.10 um, 90 nm, 65 nm or less, to fabricate the chips. The size of the CMOS logic process employed typically defines the smallest minimum lithographic dimension that can be fabricated on the chip using the lithographic masks, which in turn, determines minimum component size. According to one embodiment, light including X-rays and extreme ultraviolet radiation may pass through these lithographic masks onto the chip to transfer the circuit design and layout for the test circuit onto the chip itself.

The EDA toolset may have configuration dialog plug-ins for the graphical user interface. The EDA toolset may have an RTL generator plug-in for the SocComp. The EDA toolset may have a SystemC generator plug-in for the SocComp. The EDA toolset may perform unit-level verification on components that can be included in RTL simulation. The EDA toolset may have a test validation testbench generator. The EDA toolset may have a dis-assembler for virtual and hardware debug port trace files. The EDA toolset may be compliant with open core protocol standards. The EDA toolset may have Transactor models, Bundle protocol checkers, OCPDis2 to display socket activity, OCPPerf2 to analyze performance of a bundle, as well as other similar programs As discussed, an EDA tool set may be implemented in software as a set of data and instructions, such as an Instance in a software library callable to other programs or an EDA tool set consisting of an executable program with the software cell library in one program, stored on a machine-readable medium. A machine-readable storage medium may include any mechanism that provides (e.g., stores and/or transmits) information in a form readable by a machine (e.g., a computer). For example, a machine-readable medium may include, but is not limited to: read only memory (ROM); random access memory (RAM); magnetic disk storage media; optical storage media; flash memory devices; DVD's; EPROMs; EEPROMs; FLASH, magnetic or optical cards; or any other type of media suitable for storing electronic instructions. The instructions and operations also may be practiced in distributed computing environments where the machine-readable media is stored on and/or executed by more than one computer system. In addition, the information transferred between computer systems may either be pulled or pushed across the communication media connecting the computer systems.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

The modeling tool may have its instructions, executable code sequences, data files, etc stored on a machine-readable storage medium. A machine-readable storage medium may include any mechanism that provides (e.g., stores and/or transmits) information in a form readable by a machine (e.g., a computer). For example, a machine-readable medium may include, but is not limited to: read only memory (ROM); random access memory (RAM); magnetic disk storage media; optical storage media; flash memory devices; DVD's; electrical, optical, digital signals); EPROMs; EEPROMs; FLASH, magnetic or optical cards; or any other type of media suitable for storing electronic instructions.

In block 1015, the circuit layout of a verified an IP block may be integrated with the entire integrated circuit. One or more lithographic masks may be generated from to be used for the manufacturing of a chip based upon that layout.

In block 1020, the chip verified with the modeling tool may be fabricated using CMOS process employing 1.0 um, 0.35 um, 0.25 um, 0.13 um, 90 nm, etc. technologies.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussions, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers, or other such information storage, transmission or display devices.

While some specific embodiments of the invention have been shown the invention is not to be limited to these embodiments. For example, most functions performed by electronic hardware components may be duplicated by software emulation. Thus, a software program written to accomplish those same functions may emulate the functionality of the hardware components. The functionality accomplished by one module may be coded into another module. The hardware logic consists of electronic circuits that follow the rules of Boolean Logic, software that contain patterns of instructions, or any combination of both. The invention is to be understood as not limited by the specific embodiments described herein, but only by scope of the appended claims.

What is claimed is:

1. An electronic design automation (EDA) modeling tool, comprising:
    a definition module to define a first full set of possible software instrumentation test points for a first simulation of an electronic system being modeled with a first executable behavioral model coded at a first level of abstraction and to define a second full set of possible software instrumentation test points for a second simulation of the electronic system being modeled with a second executable behavioral model coded at a second level of abstraction, where the second full set of possible software instrumentation tests is configured to capture similar measurement quantities as the first full set of possible software instrumentation tests;
    a population module to populate instances of a first subset of possible software instrumentation test points in the first executable behavioral model, as well as populate instances of a second subset of possible software instrumentation test points in the second executable behavioral model; and
    a performance instrumentation platform to then create a first set of software objects associated with one or more of the first subset of possible software instrumentation test points that are actually selected by a user to be enabled for a run of the first simulation, wherein the performance instrumentation platform to then also create a second set of software objects associated with one or more of the second subset of possible software instrumentation test points that are selected by the user to be enabled for a run of the second simulation wherein the modules making up the EDA modeling tool are implemented in logic blocks of electronic hardware, software coding, and any combination of the two, where portions implemented in software coding are stored in an executable format by a processor on a non-transitory machine-readable medium.

2. The modeling tool of claim 1, wherein the first executable behavioral model is a SystemC model and the second executable behavioral model is a register transfer level (RTL) model.

3. The modeling tool of claim 1, wherein the second set of software objects are configured to be coded at an abstraction level in RTL without being synthesized by a logic synthesis tool, the first and the second set of possible software instrumentation test points are defined prior to, or during the run time of its corresponding simulation of the electronic system.

4. The modeling tool of claim 1, further comprising:
a comparison module to compare the similar measurement quantities between the first and second enabled subsets of instrumentation points to discern differences in the executable behavioral models coded at different levels of abstraction.

5. The modeling tool of claim 1, wherein the performance instrumentation platform to also manage the software objects and associated instrumentation test points of the first executable behavioral model and the software objects and associated instrumentation test points of the second executable behavioral model by enabling and disabling the first and second set of test points, wherein the definition module further includes a creation layer for each population module, and the integrated circuit is a system on a chip with an interconnect.

6. The modeling tool of claim 5, wherein the definition module, population module, and the performance instrumentation platform in combination form a component object model based performance instrumentation infrastructure that is configured for use with any type of instrumented module.

7. A method for EDA design automation modeling, comprising:
defining intended software instrumentation test points;
instrumenting the software instrumentation test points to a first executable behavioral model having a first level of abstraction that models an electronic system of an integrated circuit including an interconnect;
instrumenting the software instrumentation test points to a second executable behavioral model having a second level of abstraction that models the electronic system;
creating software objects associated with an enabled subset of the intended software instrumentation test points during run-time of a first simulation of the electronic system associated with the first executable behavioral model; and
creating software objects associated with an enabled subset of the intended software instrumentation test points during run-time of a second simulation of the electronic system associated with the second executable behavioral model;
using the created software objects from the first behavioral model and the second behavioral model in a performance analysis.

8. The method of claim 7, further comprising:
collecting performance data using the enabled subset of intended software instrumentation test points;
disabling the instrumentation test points not included in the enabled subset of the intended software instrumentation test points; and
recording the performance data into a data storage unit.

9. A non-transitory machine-readable medium containing instructions stored thereon, which when executed by a machine, to cause the machine to perform the operations of claim 7.

10. A non-transitory machine-readable medium storing executable program instructions which when executed cause a data processing system to perform operations, comprising:
defining a first and second set of software instrumentation test points and an associated first and second set of performance analysis units;
populating the first set of software instrumentation test points and the associated first set of performance analysis units in a first model coded at a first level of abstraction that models an electronic design of an integrated circuit including an interconnect;
populating the second set of software instrumentation test points and associated second set of performance analysis units in a second model coded at a second level of abstraction that models the electronic design;
creating a first set of software instances associated with an enabled subset of the first set of software instrumentation test points and associated enabled subset of the first set of performance analysis units during run-time of a first simulation of the electronic design associated with the first model; and
creating a second set of software instances associated with an enabled subset of the second set of software instrumentation test points and associated enabled subset of the second set of performance analysis units during run-time of a second simulation of the electronic design associated with the second model.

11. The medium of claim 10, further comprising:
collecting performance data using the enabled subset of the first and second set of intended software instrumentation test points;
invoking at least one performance analysis algorithm installed in the performance analysis units when collected data from the associated instrumentation points becomes available to each performance analysis unit;
disabling the instrumentation test points not included in the enabled subset of the intended software instrumentation test points and disabling associated performance analysis units; and
recording the performance data into a data storage unit.

12. The medium of claim 10, further comprising:
setting sampling rates for the enabled subset of the first and second set of software instrumentation test points and associated first and second set of performance analysis units during run-time of the first and second simulations.

13. The medium of claim 10, which stores additional instructions which when executed, cause the machine to perform further operations comprising:
recording the analyzed data of the performance analysis units to a transaction based database, wherein the performance analysis units are configured with a plurality of performance analysis algorithms to analyze performance of the electronic design during run-time of the first and second simulation and thus reduce the amount of data recorded to the database.

14. The medium of claim 10, wherein the first set of software instrumentation test points and associated first set of performance analysis units of the first simulation correspond to the second set of software instrumentation test points and associated second set of performance analysis units of the second simulation.

15. The medium of claim 10, wherein the performance analysis units comprise an average performance analysis unit to compute the average value of interest during a period of time, a count performance analysis unit to count the occurrences of interest during a period of time, and a utilization performance analysis unit counter to calculate the utilization of interest during a period of time.

16. The medium of claim 15, which stores additional instructions which when executed, to cause the machine to perform further operations comprising:
managing the first set of software instrumentation test points and associated first set of performance analysis units of the first model and the second set of software instrumentation test points and associated second set of performance analysis units of the second model with a performance software instrumentation module that enables and disables the first and second sets of test points and associated performance analysis units.

17. A method for EDA design automation, comprising:
defining intended software instrumentation test points and associated performance analysis counters;
instrumenting the software instrumentation test points and associated performance analysis counters to a first model that models an electronic design of an integrated circuit including an interconnect;
instrumenting the software instrumentation test points and associated performance analysis counters to a second model that models the electronic design;
creating software instances associated with an enabled subset of the intended software instrumentation test points and associated performance analysis counters during run-time of a first simulation of the electronic design associated with the first model;
creating software instances associated with an enabled subset of the intended software instrumentation test points and associated performance analysis counters during run-time of a second simulation of the electronic design associated with the second model;
collecting performance data using the enabled subset of intended software instrumentation test points; and
invoking at least one performance analysis algorithm installed in performance analysis units when collected data from the associated instrumentation point becomes available to each performance analysis unit.

18. The method of claim 17, further comprising:
disabling the instrumentation test points not included in the enabled subset of the intended software instrumentation test points and disabling associated performance analysis counters; and
recording the performance data to a data storage unit.

19. The method of claim 18, further comprising:
analyzing collected data received from the instrumentation test points occurs after invoking at least one performance analysis algorithm installed in performance analysis units; and
comparing the analysis of the performance analysis units of the first simulation to the analysis of the performance analysis units of the second simulation in order to perform a performance validate between the first and second models.

20. The method of claim 17, wherein the performance analysis counters are configured with a plurality of performance analysis algorithms to analyze collected data received from the instrumentation test points during run-time of the first and second simulations, wherein a plurality of software instrumentation test points are each associated with a performance analysis unit.

* * * * *